United States Patent
Kurahashi et al.

(10) Patent No.: US 8,440,907 B2
(45) Date of Patent: May 14, 2013

(54) SOLAR CELL, SOLAR CELL STRING AND SOLAR CELL MODULE

(75) Inventors: Takahisa Kurahashi, Kashiba (JP); Hirotaka Sato, Katsuragi (JP); Akira Miyazawa, Kitakatsuragi-gun (JP); Kyotaro Nakamura, Nara (JP); Toshio Kimura, Kitakatsuragi-gun (JP); Masaomi Hioki, Takaichi-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 650 days.

(21) Appl. No.: 12/296,748

(22) PCT Filed: Mar. 15, 2007

(86) PCT No.: PCT/JP2007/055171
§ 371 (c)(1),
(2), (4) Date: Sep. 9, 2009

(87) PCT Pub. No.: WO2007/119365
PCT Pub. Date: Oct. 25, 2007

(65) Prior Publication Data
US 2010/0018562 A1    Jan. 28, 2010

(30) Foreign Application Priority Data

Apr. 14, 2006 (JP) .............................. 2006-112232
Jul. 13, 2006 (JP) .............................. 2006-192542

(51) Int. Cl.
*H01L 31/00* (2006.01)
*H01L 27/14* (2006.01)

(52) U.S. Cl.
USPC ....................... 136/256; 136/252; 257/459

(58) Field of Classification Search ................. None
See application file for complete search history.

(56) References Cited

U.S. PATENT DOCUMENTS 3,966,499 A * 6/1976 Yasui et al. .................... 136/206
4,228,315 A * 10/1980 Napoli .......................... 136/256
(Continued)

FOREIGN PATENT DOCUMENTS

JP     55-95376       7/1980
JP     55-095377 A    7/1980
(Continued)

OTHER PUBLICATIONS

U.S. Appl. No. 12/089,564, filed Apr. 8, 2008, entitled Solar Cell, Interconnector-Equipped Solar Cell, Solar Cell String, and Solar Cell Module.

(Continued)

*Primary Examiner* — Jennifer Michener
*Assistant Examiner* — Christopher Danicic
(74) *Attorney, Agent, or Firm* — Nixon & Vanderhye, P.C.

(57) ABSTRACT

A solar cell includes a semiconductor substrate having a photoelectric converting portion, a first electrode formed on a first main surface of the semiconductor substrate, and a second electrode connected to the first electrode on the first main surface. The first electrode includes a plurality of first connecting portions to be connected to an interconnector and a first non-connecting portion not connected to an interconnector. The first non-connecting portion is arranged between first connecting portions to electrically connect the first connecting portions together. The first connecting portion and first non-connecting portion are coupled forming an angle larger than 90° and smaller than 180°. A solar cell string and a solar cell module employ the solar cells.

21 Claims, 29 Drawing Sheets

U.S. PATENT DOCUMENTS

| | | | |
|---|---|---|---|
| 4,301,322 A * | 11/1981 | Amick | 136/256 |
| 4,487,989 A * | 12/1984 | Wakefield et al. | 136/256 |
| 4,525,594 A | 6/1985 | Pschunder | |
| 4,590,327 A | 5/1986 | Nath et al. | |
| 4,940,496 A * | 7/1990 | Matsumoto et al. | 136/256 |
| 5,034,068 A * | 7/1991 | Glenn et al. | 136/256 |
| 5,158,618 A | 10/1992 | Rubin et al. | |
| 5,248,347 A | 9/1993 | Ochi | |
| 5,330,583 A | 7/1994 | Asai et al. | |
| 5,430,616 A | 7/1995 | Katsu et al. | |
| 5,512,107 A | 4/1996 | van den Berg | |
| 5,733,382 A | 3/1998 | Hanoka | |
| 5,972,732 A | 10/1999 | Gee et al. | |
| 6,313,396 B1 | 11/2001 | Glenn | |
| 6,315,575 B1 | 11/2001 | Kajimoto | |
| 6,407,327 B1 | 6/2002 | Ralph et al. | |
| 6,665,932 B2 | 12/2003 | Saito | |
| 6,841,728 B2 | 1/2005 | Jones et al. | |
| 7,307,210 B2 | 12/2007 | Wakuda et al. | |
| 2002/0173180 A1 | 11/2002 | Saito | |
| 2003/0000571 A1 | 1/2003 | Wakuda et al. | |
| 2004/0200522 A1 | 10/2004 | Fukawa et al. | |
| 2004/0261840 A1 | 12/2004 | Schmit et al. | |
| 2005/0093115 A1 | 5/2005 | Eytcheson | |
| 2006/0260673 A1 | 11/2006 | Takeyama | |
| 2007/0231186 A1 | 10/2007 | Shima et al. | |
| 2009/0159116 A1 | 6/2009 | Umetani | |
| 2009/0277491 A1 | 11/2009 | Nakamura | |
| 2010/0116323 A1 | 5/2010 | Katayama et al. | |

FOREIGN PATENT DOCUMENTS

| | | |
|---|---|---|
| JP | 60-42854 A | 3/1985 |
| JP | 60-239067 | 11/1985 |
| JP | 60-261161 | 12/1985 |
| JP | 60-261161 A | 12/1985 |
| JP | 61-15378 A | 1/1986 |
| JP | 61-107775 | 5/1986 |
| JP | 61-136561 | 8/1986 |
| JP | 61-136561 A | 8/1986 |
| JP | 61-138256 U | 8/1986 |
| JP | 62-16579 | 1/1987 |
| JP | 62-16579 A | 1/1987 |
| JP | 62-112381 | 5/1987 |
| JP | 63-187657 | 8/1988 |
| JP | 1-125563 U | 8/1989 |
| JP | 1-198082 A | 8/1989 |
| JP | 2-271561 | 11/1990 |
| JP | 3-262314 | 11/1991 |
| JP | 4-44166 U | 4/1992 |
| JP | 4-342172 | 11/1992 |
| JP | 4-342172 A | 11/1992 |
| JP | 6-151907 | 5/1994 |
| JP | 6-196744 A | 7/1994 |
| JP | 6-204510 | 7/1994 |
| JP | 6-204510 A | 7/1994 |
| JP | 06-275858 | 9/1994 |
| JP | 09213979 | 8/1997 |
| JP | 9-283781 | 10/1997 |
| JP | 10-144943 | 5/1998 |
| JP | 11-177117 A | 7/1999 |
| JP | 11-251613 A | 9/1999 |
| JP | 11-312820 | 11/1999 |
| JP | 2000-114556 | 4/2000 |
| JP | 2000-323208 A | 11/2000 |
| JP | 2001-044459 | 2/2001 |
| JP | 2001-135846 | 5/2001 |
| JP | 2002-026345 | 1/2002 |
| JP | 2002-141496 | 5/2002 |
| JP | 2002-319691 | 10/2002 |
| JP | 2002-343475 | 11/2002 |
| JP | 2002-343475 A | 11/2002 |
| JP | 2002-353475 | 12/2002 |
| JP | 2002-359388 | 12/2002 |
| JP | 2003-69055 A | 3/2003 |
| JP | 2003-298095 A | 10/2003 |
| JP | 2004-134654 | 4/2004 |
| JP | 2004-134654 A | 4/2004 |
| JP | 2004-193444 | 7/2004 |
| JP | 2005-072115 | 3/2005 |
| JP | 2005-072115 A | 3/2005 |
| JP | 2005-123445 A | 5/2005 |
| JP | 2005-142282 | 6/2005 |
| JP | 2005-191491 A | 7/2005 |
| JP | 2005-252062 | 9/2005 |
| JP | 2005-252108 | 9/2005 |
| JP | 2005-302902 | 10/2005 |
| JP | 2006-089815 A | 4/2006 |
| JP | 2007-109960 | 4/2007 |
| WO | 2005-038934 A | 10/2004 |

OTHER PUBLICATIONS

U.S. Appl. No. 12/090,176, filed Apr. 11, 2008, entitled Interconnector, Solar Cell String Using the Interconnector and Method of Manufacturing Thereof, and a Solar Cell Module Using the Solar Cell String.

Official Action dated Jan. 18, 2011 issued in co-pending U.S. Appl. No. 12/089,564 of Nakamura, filed Apr. 8, 2008.

Official Action dated Nov. 15, 2010 issued co-pending U.S. Appl. No. 12/233,021 of Katayama, filed Jul. 21, 2008.

Official Action dated Mar. 1, 2011 issued in co-pending U.S. Appl. No. 12/223,021 of Katayama et al, filed Jul. 21, 2008.

Official Action dated Mar. 3, 2011 issued in co-pending U.S. Appl. No. 12/090,176 of Umetani et al, filed Apr. 14, 2008.

Advisory Action dated Mar. 8, 2011 issued in co-pending U.S. Appl. No. 12/089,564 of Nakamura et al, filed Apr. 8, 2008.

Advisory Action dated May 20, 2011, issued in copending U.S. Appl. No. 12/090,176 of Umetani et al, filed Apr. 14, 2008.

Advisory Action dated May 24, 2011, issued in copending U.S. Appl. No. 12/223,021 of Katayama et al, filed Jul. 21, 2008.

Official Action dated Sep. 27, 2010 issued in co-pending U.S. Appl. No. 12/089,564 of Nakamura, filed Apr. 8, 2008.

Katayama et al, U.S. Appl. No. 12/223,021, filed Jul. 21, 2008 entitled "Interconnector Solar Cell String Using the Interconnector and Method of Manufacturing Thereof, and Solar Cell Module Using the Solar Cell String".

International Search Report for PCT/JP2006/055171 mailed Apr. 17, 2007.

Microfilm of the specification and drawings annexed to the request of Japanese Utility Model Application No. 21937/1988, (Laid Open No. 125563/1989) Toshiba Corporation., Aug. 28, 1989.

Microfilm of the specification and drawings annexed to the request of Japanese Utility Model Application No. 87157/1990 (Laid Open No. 44166/1992) Sharp Corporation, Apr. 15, 1992.

Microfilm of the specification and drawings annexed to the request of Japanese Utility Model Application No. 20880/1985 (Laid Open No. 138256/1986) Sharp Corporation Aug. 27, 1986.

U.S. Office Action mailed Sep. 14, 2010 in U.S. Appl. No. 12/090,176.

Examiner's Answer dated Oct. 12, 2011, issued in copending U.S. Appl. No. 12/090,176 of Umetani et al, filed Apr. 14, 2008.

International Search Report for PCT/JP2006/319938, dated Dec. 12, 2006.

International Search Report for PCT/JP2006/320275, dated Jan. 9, 2007.

International Search Report for PCT/JP2007/050665, dated Apr. 3, 2007.

* cited by examiner

SOLAR CELL, SOLAR CELL STRING AND SOLAR CELL MODULE

This application is the U.S. national phase of International Application No. PCT/JP2007/055171, filed 15 Mar. 2007 which designated the U.S. and claims priority to Japanese Application No(s). 2006-112232, filed 14 Apr. 2006 and 2006-192542 filed 13 Jul. 2006, the entire contents of each of which are hereby incorporated by reference.

TECHNICAL FIELD

The present invention relates to solar cells, solar cell strings, and solar cell modules. Particularly, the present invention relates to a solar cell, a solar cell string, and a solar cell module that can have generation of a crack in a solar cell reduced when warpage occurs in the solar cell during a cooling step subsequent to connection of an interconnector.

BACKGROUND ART

Expectations for a solar cell that directly converts sunlight energy into electric energy as the energy source for the next generation has rapidly grown these few years particularly from the standpoint of global environmental problems. Among the various types of solar cells employing a compound semiconductor or an organic material, a solar cell employing silicon crystal is now the main stream.

FIG. 26 represents a schematic sectional view of an example of a conventional solar cell. The solar cell has an n+ layer 11 formed at the light-receiving face of a p-type silicon substrate 10. A pn junction is formed by p-type silicon substrate 10 and n+ layer 11. An anti-reflection film 12 and a silver electrode 13 are formed on the light-receiving face of p-type silicon substrate 10. Further, a p+ layer 15 is formed at the back side of p-type silicon substrate 10, opposite to the light-receiving face. In addition, an aluminium electrode 14 and a silver electrode 16 are formed on the back side of p-type silicon substrate 10. The aforementioned pn junction corresponds to a photoelectric conversion portion at p-type silicon substrate 10.

FIG. 27 (a)-(i) represents an example of a fabrication method of a conventional solar cell. First, as shown in FIG. 27(a), a silicon ingot 17 obtained by dissolving p-type silicon crystal material in a crucible and recrystallizing the material is cut into silicon blocks 18. As shown in FIG. 27(b), a silicon block 18 is cut with a wire saw to produce a p-type silicon substrate 10.

Then, the surface of p-type silicon substrate 10 is etched using alkali or acid to remove a damage layer 19 generated during the slicing process of p-type silicon substrate 10 shown in FIG. 27(c). At this stage, microscopic asperities (not shown) can be formed at the surface of p-type silicon substrate 10 by adjusting the etching conditions. The asperities are advantageous in that reflection of sunlight incident on the surface of p-type silicon substrate 10 is reduced to allow the photovoltaic conversion efficiency of the solar cell to be improved.

Subsequently, as shown in FIG. 27(d), a dopant solution 20 containing a compound including phosphorus is applied on one main surface (hereinafter, referred to as "first main surface") of p-type silicon substrate 10. By heating p-type silicon substrate 10 with dopant solution 20 applied for 5 to 30 minutes at the temperature of 800° C. to 950° C. to cause diffusion of phosphorus that is an n type dopant at the first main surface of p-type silicon substrate 10, an n+ layer 11 is formed at the first main surface of p-type silicon substrate 10, as shown in FIG. 27(e). The method of forming n+ layer 11 includes a method of vapor phase diffusion using $P_2O_5$ or $POCl_3$ in addition to the method of applying a dopant solution.

Following the removal of a glass layer formed at the first main surface of p-type silicon substrate 10 at the time of phosphorus diffusion by an acid treatment, an anti-reflection film 12 is formed on the first main surface of p-type silicon substrate 10, as shown in FIG. 27(f). Known methods to form anti-reflection film 12 includes a method of forming a titanium oxide film by means of atmospheric pressure CVD, and forming a silicon nitride film by means of plasma CVD. In the case where phosphorus is to be diffused by the method of applying a dopant solution, the usage of a dopant solution containing the material of anti-reflection film 12 in addition to phosphorus allows simultaneous formation of n+ layer 11 and anti-reflection film 12. There are also cases where anti-reflection film 12 is formed after formation of a silver electrode.

As shown in FIG. 27(g), an aluminium electrode 14 is formed on the other main surface (hereinafter, referred to as "second main surface") of p-type silicon substrate 10. In addition, a p+ layer 15 is formed at the second main surface of p-type silicon substrate 10. The formation of aluminium electrode 14 and a p+ layer 15 can be carried out as set forth below. For example, aluminium paste composed of aluminium powder, glass frit, resin and an organic solvent is applied by screen-printing and the like, followed by heat-treating p-type silicon substrate 10 for fusion of aluminium to generate an alloy with silicon, resulting in the formation of an aluminium-silicon alloy layer. Under this aluminium-silicon alloy layer, p+ layer 15 is formed. In addition, aluminium electrode 14 is formed on the second main surface of p-type silicon substrate 10. The difference in the dopant concentration between p-type silicon substrate 10 and p+ layer 15 causes a potential difference (acting as a potential barrier) at the interface between p-type silicon substrate 10 and p+ layer 15, which prevents optically-generated carriers from recoupling in the proximity of the second main surface layer of p-type silicon substrate 10. Accordingly, the short-circuit current (Isc) and the open circuit voltage (Voc) of the solar cell are both improved.

Then, a silver electrode 16 is formed on the second main surface of p-type silicon substrate 10, as shown in FIG. 27(h). Silver electrode 16 can be produced by printing silver paste composed of silver powder, glass frit, resin, and an organic solvent by means of screen-printing and the like, followed by heat-treating p-type silicon substrate 10.

Then, a silver electrode 13 is formed on the first main surface of p-type silicon substrate 10, as shown in FIG. 27(i). The pattern design such as the line width, pitch, thickness and the like of silver electrode 13 is crucial for the purpose of setting low the series resistance including the contact resistance with p-type silicon substrate 10 and also reducing the area where silver electrode 13 is formed to avoid reduction in the incident sunlight. An exemplified method of forming silver electrode 13 includes the steps of applying silver paste composed of silver powder, glass frit, resin, and an organic solvent on the surface of an anti-reflection film 12 by screen-printing, for example, and heat-treating p-type silicon substrate 10 to cause passage of the silver paste through anti-reflection film 12, allowing favorable electrical contact with the first main surface of p-type silicon substrate. This fire-through process is employed in a mass production line.

A solar cell structured as shown in FIG. 26 can be fabricated as set forth above. A solder coat may be applied on the surface of silver electrodes 13 and 16 by immersing p-type silicon substrate 10 having silver electrodes 13 and 16 formed in a molten solder bath. This solder coating step may be omitted depending upon the process. Furthermore, the solar cell fabricated as set forth above may be irradiated with pseudo sunlight using a solar simulator to measure the current-voltage (IV) characteristics of the solar cell to test the IV characteristics.

A plurality of solar cells are connected in series to constitute a solar cell string. Then, the solar cell string is sealed with a sealant to be offered for sale and usage in the form of a solar cell module.

FIG. 28(a)-(e) represents an example of a fabrication method of a conventional solar cell module. Referring to FIG. 28(a), an interconnector 31 that is a conductive member is connected on the silver electrode at the first main surface of solar cell 30.

Referring to FIG. 28(b), a row of solar cells 30 having interconnector 31 connected are arranged. Interconnector 31 connected to the silver electrode located at the first main surface of a solar cell 30 has its other end connected to the silver electrode located at the second main surface of another solar cell 30. Thus, a solar cell string 34 is produced.

Referring to FIG. 28(c), the solar cell strings are arranged and connected with each other by connecting in series an interconnector 31 protruding from both ends of a solar cell string with an interconnector 31 protruding from both ends of another solar cell string by means of a wiring material 33 that is a conductive member.

Referring to FIG. 28(d), the connected solar cell string 34 is sandwiched between EVA (ethylene vinyl acetate) films 36, identified as a sealing member, and then further sandwiched between a glass sheet 35 and a back film 37. The air bubbles present between EVA films 36 are removed by reducing the pressure, and heat treatment is applied. Accordingly, EVA film 36 is cured, whereby the solar cell string is sealed in the EVA. Thus, a solar cell module is produced.

Referring to FIG. 28(e), the solar cell module is placed in an aluminium frame 40. A terminal box 38 including a cable 39 is attached to the solar cell module. Then, the solar cell module produced as set forth above is irradiated with pseudo sunlight using a solar simulator to measure the current-voltage (IV) characteristics of the solar cell to test the IV characteristics.

The schematic plan view of FIG. 29 represents the configuration of silver electrode 13 formed on the first main surface of p-type silicon substrate 10, which will be the light-receiving face of the solar cell of FIG. 26. Silver electrode 13 is formed including one linear bus bar electrode 13a of a relatively large width, and a plurality of linear finger electrodes 13b of a relatively small width, extending from bus bar electrode 13a.

The schematic plan view of FIG. 30 represents the configuration of aluminium electrode 14 and silver electrode 16 formed on the second main surface of p-type silicon substrate 10, identified as the back side of the solar cell of FIG. 26. Aluminium electrode 14 is formed nearly all over the second main surface of p-type silicon substrate 10, whereas silver electrode 16 is formed only at a portion of the second main surface of p-type silicon substrate 10. Silver electrode 16 that allows a solder coat to be applied may be required since it is difficult to apply a solder coat on aluminium electrode 14.

FIG. 31 schematically shows a sectional view of a solar cell string having the solar cells of the configuration of FIG. 26 connected in series. Interconnector 31 secured by means of soldering or the like to bus bar electrode 13a at the light-receiving face of a solar cell is fastened to silver electrode 16 located at the back side of another adjacent solar cell by means of soldering. In FIG. 31, the n+ layer, p+ layer and anti-reflection film are not depicted.

Patent Document 1: Japanese Patent Laying-Open No. 2005-142282

DISCLOSURE OF THE INVENTION

Problems to be Solved by the Invention

The rapid proliferation of photovoltaic power generation systems has necessitated reduction in the fabrication cost of solar cells. Rendering larger and thinner the silicon substrate that is a semiconductor substrate are effective means for reducing the fabrication cost of solar cells. However, a larger and thinner silicon substrate provides the disadvantage that warpage will occur at the solar cell, leading to the possibility of a crack being generated at the light-receiving face of the solar cell in contact with a bus bar electrode of the solar cell, since an interconnector formed of copper contracts more greatly than the solar cell due to the difference in the thermal expansion coefficient between the silicon substrate of the solar cell and the interconnector (the thermal expansion coefficient of silicon is $3.5 \times 10^{-6}$/K whereas the thermal expansion coefficient of copper is $17.6 \times 10^{-6}$/K, which is approximately 5 times larger) during a cooling step subsequent to a heating step in which a bus bar electrode at the light-receiving face of the solar cell and an interconnector are fastened by soldering and the like for connection, in the production of a solar cell string.

Patent Document 1 (Japanese Patent Laying-Open No. 2005-142282) discloses the method of providing a small cross-sectional area section where the cross-sectional area is locally reduced at the interconnector that connects adjacent solar cells. A concave warpage occurs at the solar cell when the interconnector and solar cell in a heated state by the aforementioned heating step are cooled down to the room temperature, as described above. At this stage, the ability to return to its former shape (resilience) is generated at the solar cell. This resilience applies tensile stress to the interconnector. According to the method disclosed in Patent Document 1, the small cross-sectional area section of the interconnector where the strength is relatively lower as compared to other portions is elongated when tensile stress is applied to the interconnector to reduce the warpage at the solar cell. There is, however, a desire for further improvement.

A possible approach to reduce the warpage at a solar cell is to produce a solar cell string by connecting solar cells having the electrodes at the light-receiving face based on a configuration shown in FIGS. 32 and 33 and the electrodes at the back side based on a configuration shown in FIG. 34, employing the interconnector disclosed in Patent Document 1. This solar cell string is exemplified in FIG. 35 corresponding to a schematic sectional view, and in FIG. 36 corresponding to a schematic enlarged plan view of the solar cell string of FIG. 35, viewed from the light-receiving face side.

As shown in FIGS. 32 and 33, silver electrode 13 formed on the light-receiving face that is the first main surface of p-type silicon substrate 10 of a solar cell includes one linear bus bar electrode 13a of a relatively large width, and a plurality of linear finger electrodes 13b having a relatively small width, extending from bus bar electrode 13a. Bus bar electrode 13a includes a linear first connecting portion 51 fastened to an interconnector for connection, and a first non-connecting portion 42 that is not connected to an interconnector. First connecting portion 51 and first non-connecting portion 42 are arranged alternately along the longitudinal direction of bus bar electrode 13a. Second non-connecting portion 42 is electrically connected to adjacent first connecting portions 51 located at both sides.

The surface contour of first connecting portion 51 is rectangular. The surface contour of an inside region 43 that is a void, adjacent to an end face of first connecting portion 51 and a side face of first non-connecting portion 42 is also rectangular.

Referring to FIG. 34, aluminium electrode 14 is formed nearly all over the second main surface of p-type silicon substrate 10. Silver electrode 16 is formed only at a portion of the second main surface of p-type silicon substrate 10. Here, silver electrodes 16 will be the second connecting portion to be fastened to the interconnector for connection. Aluminium electrode 14 located between silver electrodes 16 will be a second non-connecting portion 14a that is not connected to an interconnector. The second main surface of p-type silicon substrate 10 that is the semiconductor substrate is located opposite to the first main surface of p-type silicon substrate 10 that is the semiconductor substrate.

In the solar cell string of FIG. 35 employing the interconnector disclosed in Patent Document 1, interconnector 31 fastened and connected by soldering or the like to first connecting portion 51 at the light-receiving face of the solar cell is fastened and connected to silver electrode 16 at the back side of another solar cell located adjacent by soldering or the like. In FIG. 35, the n+ layer, p+ layer, and anti-reflection film are not depicted.

Referring to FIGS. 35 and 36, small cross-sectional area section 41 of interconnector 31 is located at inside region 43 and second non-connecting portion 14a of the solar cell, and is not fastened by soldering or the like. Therefore, when tensile stress is applied to interconnector 31, small cross-sectional area section 41 of relatively low strength as compared to other portions can elongate arbitrarily, allowing reduction in the warpage at the solar cell.

However, this solar cell string had the possibility of a crack being generated in a solar cell at the interface section between first connecting portion 51 and inside region 43 at the light-receiving face of the solar cell constituting the solar cell string due to the warpage occurring at the solar cell in the cooling step subsequent to interconnector connection. Therefore, improvement thereof was desired.

In view of the foregoing, an object of the present invention is to provide a solar cell, a solar cell string, and a solar cell module that can have generation of a crack in the solar cell reduced when warpage occurs at the solar cell in a cooling step subsequent to interconnector connection.

Means for Solving the Problems

The present invention is directed to a solar cell including a semiconductor substrate having a photoelectric converting portion, a first electrode formed on a first main surface of the semiconductor substrate, and a second electrode electrically connected to the first electrode on the first main surface. The first electrode includes a plurality of first connecting portions to be connected to an interconnector, and a first non-connecting portion not connected to an interconnector. The first non-connecting portion is arranged between the first connecting portions to electrically connect the first connecting portions together. The first connecting portion and the first non-connecting portion are coupled forming an angle larger than 90° and smaller than 180°.

In the solar cell of the present invention, the first non-connecting portion may extend from an end face of the first connecting portion.

In the solar cell of the present invention, the first non-connecting portion may extend from a side face of the first connecting portion.

In the solar cell of the present invention, the first non-connecting portion may be formed of a combination of straight portions.

In the solar cell of the present invention, the first non-connecting portion may include an arc portion.

In the solar cell of the present invention, the cross-sectional area of the first non-connecting portion is preferably not more than ½ the cross-sectional area of the first connecting portion.

In the solar cell of the present invention, a second connecting portion to be connected to an interconnector, and a second non-connecting portion not connected to an interconnector may be formed alternately on a second main surface opposite to the first main surface of the semiconductor substrate.

The solar cell of the present invention preferably includes a portion where the first connecting portion and the second connecting portion are located symmetric about the semiconductor substrate.

Further, the present invention is directed to a solar cell string including a plurality of solar cells set forth above connected. With regards to solar cells adjacent to each other, the first connecting portion of a first solar cell and the second connecting portion of a second solar cell are electrically connected by an interconnector in the solar cell string.

In the solar cell string of the present invention, the interconnector may be bent between the first solar cell and the second solar cell.

In the solar cell string of the present invention, a small cross-sectional area section having the cross-sectional area of the interconnector locally reduced is preferably arranged at at least one of a site corresponding to an inside region, adjacent to a side face of the first non-connecting portion and an end face of the first connecting portion, and a site corresponding to the second non-connecting portion.

In addition, the present invention is directed to a solar cell module including the solar cell string set forth above sealed with a sealant.

In the solar cell of the present invention, at least one of the first connecting portions adjacent to an end of the first main surface may be arranged apart from the end of the first main surface.

In the solar cell of the present invention, the surface contour of the inside region adjacent to a side face of the first non-connecting portion and an end face of the first connecting portion preferably takes a shape of an arc at a leading end portion of the first connecting portion side.

In the solar cell of the present invention, the surface contour of the inside region preferably takes the shape of a circle, an ellipse, or a track.

In the solar cell of the present invention, a second connecting portion to be connected to an interconnector and a second non-connecting portion not connected to an interconnector are preferably formed alternately on a second main surface opposite to the first main surface of the semiconductor substrate.

In the solar cell of the present invention, the length of the inside region in a direction of arrangement of the first connecting portion and the first non-connecting portion may be shorter than the length of the second non-connecting portion, opposite to the inside region with the semiconductor substrate therebetween, in the direction of arrangement of the second connecting portion and the second non-connecting portion.

The solar cell of the present invention may include a portion where the second non-connecting portion is not formed at a location symmetric to the location where the inside region is formed, about the semiconductor substrate.

Moreover, the present invention is directed to a solar cell string including a plurality of solar cells set forth above connected. With regards to solar cells adjacent to each other, the first connecting portion of a first solar cell and the second connecting portion of a second solar cell are electrically connected by an interconnector.

In the solar cell string of the present invention, a small cross-sectional area section of an interconnector having the cross-sectional area locally reduced is preferably arranged at at least one of a site corresponding to the inside region and a site corresponding to the second non-connecting portion.

Furthermore, the present invention is directed to a solar cell module including the solar cell string set forth above sealed with a sealant.

Effects of the Invention

According to the present invention, there can be provided a solar cell, a solar cell string, and a solar cell module that can have generation of a crack in a solar cell reduced when warpage occurs at the solar cell in a cooling step subsequent to interconnector connection.

DESCRIPTION OF THE REFERENCE CHARACTERS

Figure 1:
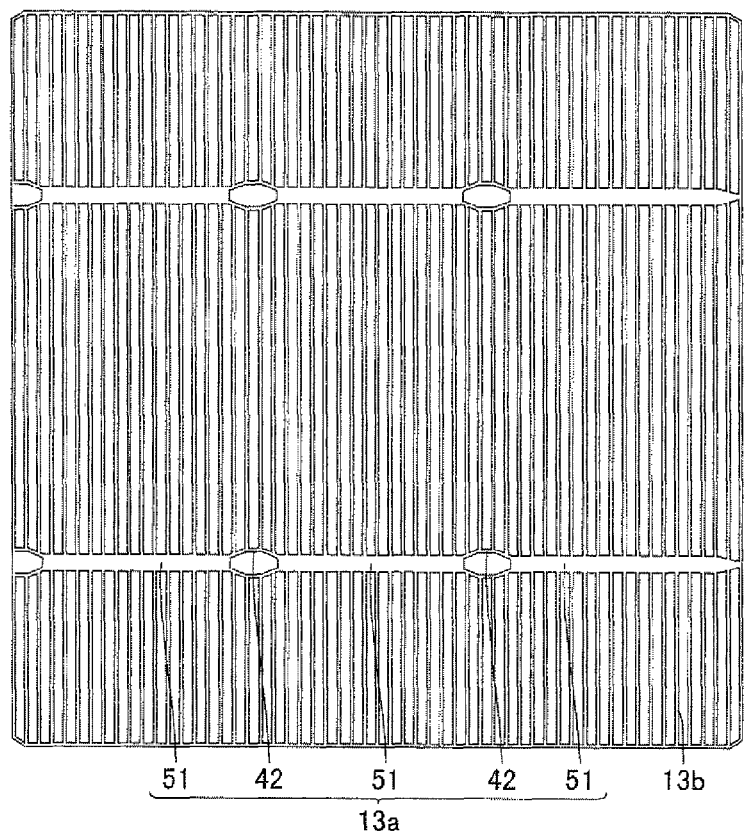
FIG. 1 is a schematic plan view of an example of a configuration of electrodes formed on a first main surface of a p-type silicon substrate that is the light-receiving face of a solar cell of the present invention.

10 p-type silicon substrate, 11 n+ layer, 12 anti-reflection film, 13 silver electrode, 13a bus bar electrode, 13b finger electrode, 14 aluminium electrode, 14a second non-connecting portion, 15 p+ layer, 16 silver electrode, 17 silicon ingot, 18 silicon block, 19 damage layer, 20 dopant solution, 30 solar cell, 31 interconnector, 33 wiring material, 34 solar cell string, 35 glass sheet, 36 EVA film, 37 back film, 38 terminal box, 39 cable, 40 aluminium frame, 41 small cross-sectional area section, 42 first non-connecting portion, 43 inside region, 51 first connecting portion, 80 first solar cell, 81 second solar cell

BEST MODES FOR CARRYING OUT THE INVENTION

Embodiments of the present invention will be described hereinafter. In the drawings of the present invention, the same reference characters denote the same or corresponding elements.

FIG. 1 is a schematic plan view of an example of the configuration of electrodes formed on a first main surface of a p-type silicon substrate 10 that is the light-receiving face of a solar cell of the present invention. The electrodes formed on the first main surface include a bus bar electrode 13a of a relatively large width, serving as a first electrode, extending horizontally in the drawing sheet, and a plurality of linear finger electrodes 13b of a relatively small width, serving as the second electrode, extending from bus bar electrode 13a in the vertical direction in the drawing sheet. Although FIG. 1 shows bus bar electrode 13a and finger electrode 13b arranged orthogonal to each other, the positional relationship thereof can be modified appropriately.

Bus bar electrode 13a includes a first connecting portion 51 of linear form, fastened to and electrically connected to an interconnector, and a first non-connecting portion 42 not connected to an interconnector. First connecting portion 51 and first non-connecting portion 42 are arranged alternately along the longitudinal direction of bus bar electrode 13a. The electrodes at the light-receiving face of FIG. 1 are configured such that at least one of first connecting portions 51 adjacent to the end of the first main surface of p-type silicon substrate 10 is disposed apart from the end of the first main surface.

Figure 2:
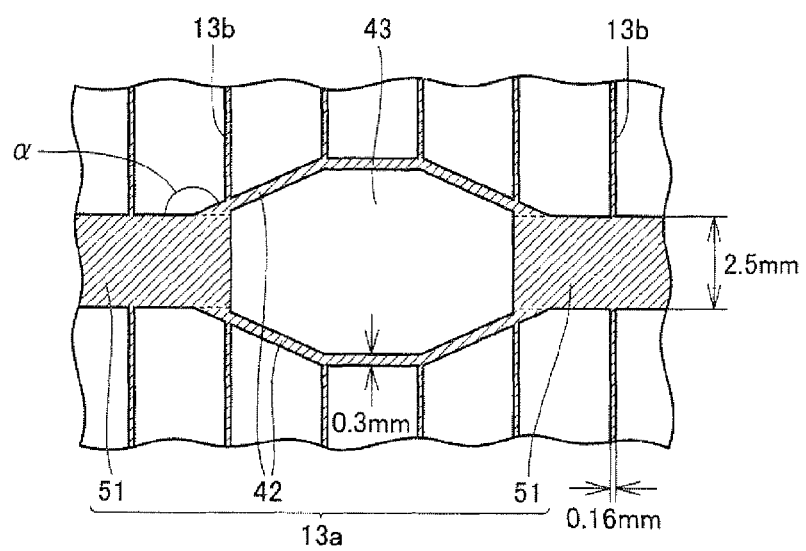
FIG. 2 is a schematic enlarged plan view of the neighborhood of the first non-connecting portion of FIG. 1.

FIG. 2 is a schematic enlarged plan view in the neighborhood of first non-connecting portion 42 of FIG. 1. As shown in FIG. 2, first non-connecting portion 42 electrically connects adjacent first connecting portions 51 together. On the first main surface is also provided an inside region 43 that is a void, adjacent to an end face of first connecting portion 51 and a side face of first non-connecting portion 42. First non-connecting portion 42 extends from a side face of a first connecting portion 51. First non-connecting portion 42 and first connecting portion 51 form an angle α of approximately 150°, which is larger than 90° and smaller than 180°.

By the configuration of setting angle α between first non-connecting portion 42 and first connecting portion 51 larger than 90° and smaller than 180° in the solar cell of the present invention, generation of a crack in the solar cell can be reduced, at the interface section between first connecting portion 51 and inside region 43 at the light-receiving face of the solar cell constituting a solar cell string, caused by warpage occurring at the solar cell during a cooling step subsequent to interconnector connection.

Although the reason is not definite, it is considered that the stress received at the interface section between first connecting portion 51 and inside region 43 at the solar cell is dispersed when warpage occurs at the solar cell during the cooling step subsequent to interconnector connection, by coupling first non-connecting portion 42 and first connecting portion 51 at an angle larger than 90° and smaller than 180°.

Figure 32:
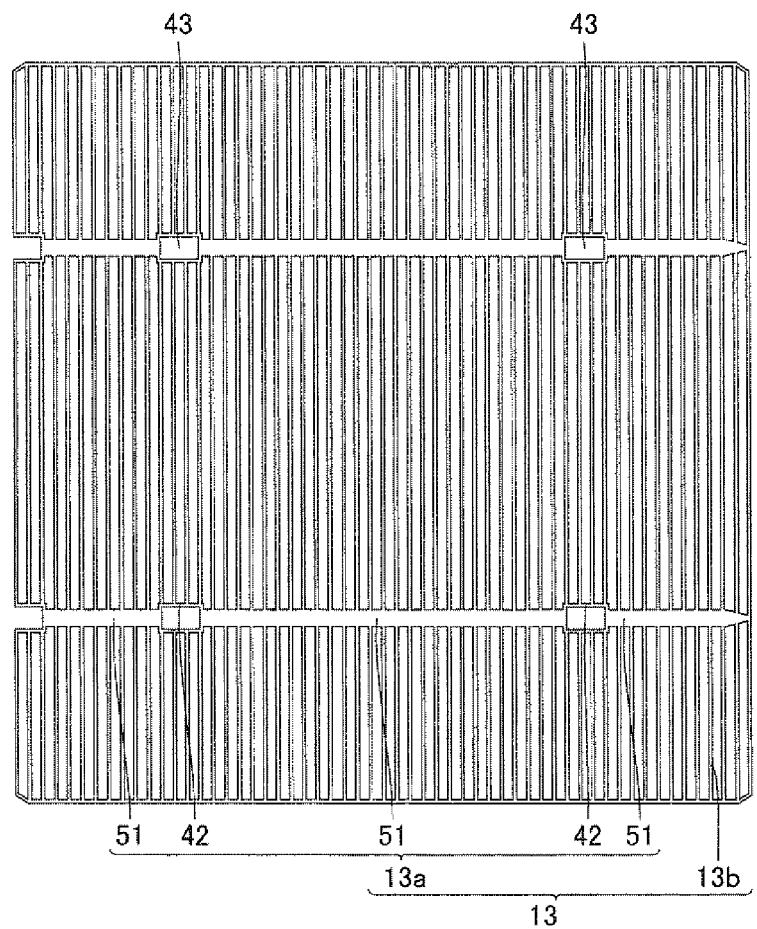
FIG. 32 is a schematic plan view of an example of a configuration of electrodes at the light-receiving face of a solar cell.
Figure 33:
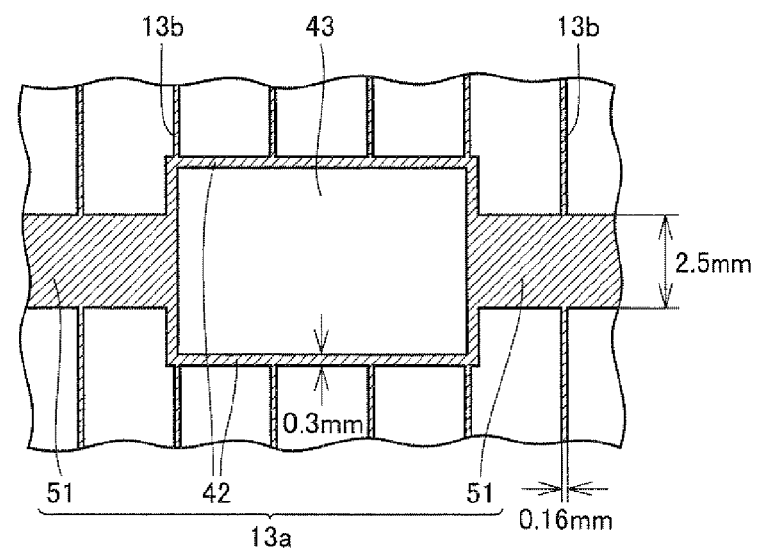
FIG. 33 is a schematic enlarged plan view of electrodes at the light-receiving face of FIG. 32, in the neighborhood of a first non-connecting portion.
Figure 34:
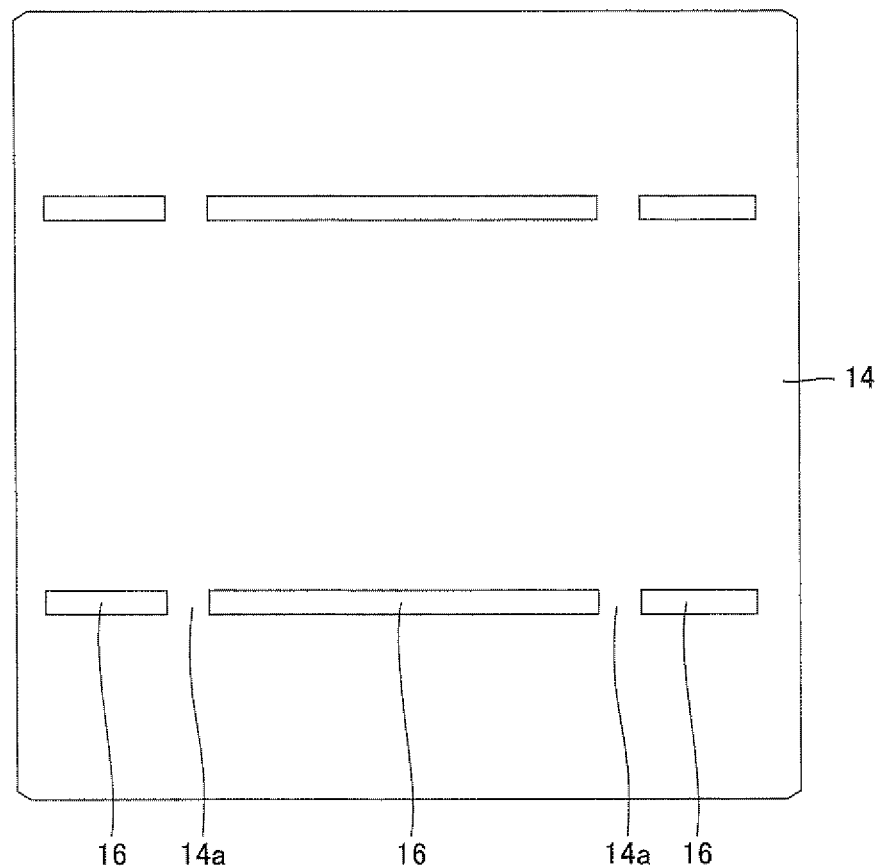
FIG. 34 is a schematic plan view of an example of a configuration of electrodes at the back side of a solar cell.
Figure 35:
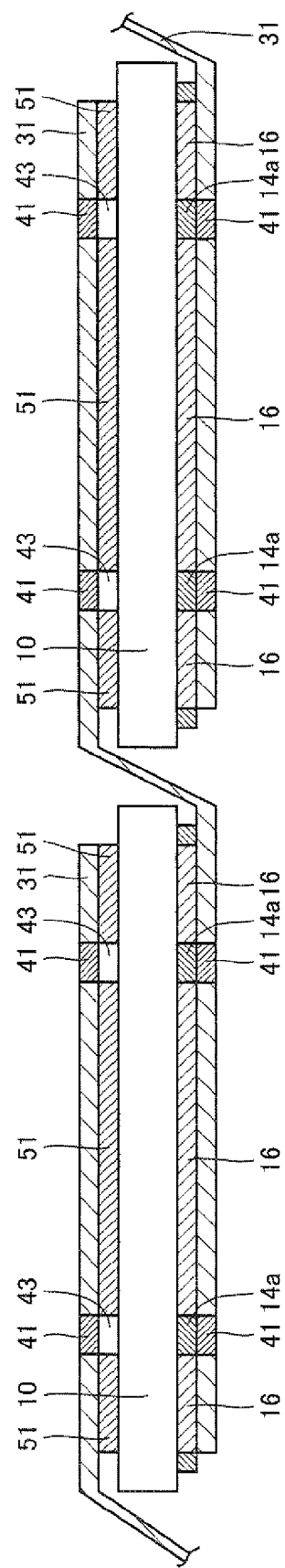
FIG. 35 is a schematic sectional view of an example of a solar cell string formed by connecting solar cells having electrodes at the light-receiving face based on the configuration shown in FIGS. 32 and 33 and electrodes at the back side based on the configuration shown in FIG. 34, by means of an interconnector disclosed in Patent Document 1.
Figure 36:
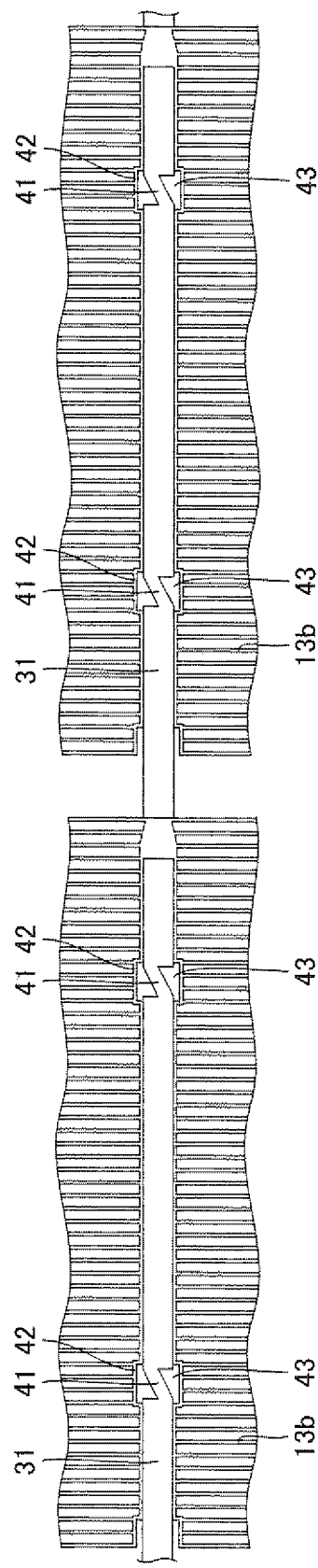
FIG. 36 is a schematic enlarged plan view of the light-receiving face of the solar cell string of FIG. 35.

When it is assumed that the length of inside region 43 in the solar cell of the present invention having the configuration set forth above (the length in the direction of arrangement of first connecting portion 51 and first non-connecting portion 42) is equal to the length of inside region 43 in the electrode at the light-receiving face based on the configuration shown in FIGS. 32 and 33 (the length in the direction of arrangement of first connecting portion 51 and first non-connecting portion 42), the shortest distance of the overall length of first non-connecting portion 42 in the solar cell of the present invention is shorter than the shortest distance of the overall length of first non-connecting portion 42 in the electrode at the light-receiving face based on the configuration shown in FIGS. 32 and 33.

Therefore, since the overall length of first non-connecting portion 42 in the solar cell of the present invention is shorter than the overall length of first non-connecting portion 42 in the electrode at the light-receiving face based on the configuration shown in FIGS. 32 and 33 when the length of inside region 43 is identical, the electric resistance at first non-connecting portion 42 in the solar cell of the present invention becomes lower than the electric resistance at first non-connecting portion 42 in the electrode at the light-receiving face based on the configuration shown in FIGS. 32 and 33.

Accordingly, the property of the solar cell of the present invention having the configuration set forth above is favorable than that of a solar cell having electrodes at the light-receiving face based on the configuration shown in FIGS. 32 and 33.

Since first non-connecting portion 42 does not overlap an interconnector, the region of the light-receiving face where first non-connecting portion 42 is disposed will correspond to a shadow-loss region. Therefore, when the width of first non-connecting portion 42 in the solar cell of the present invention is equal to the width of first non-connecting portion 42 in the solar cell having electrodes at the light-receiving face based on the configuration shown in FIGS. 32 and 33, the shadow-loss region in the solar cell of the present invention can be reduced as compared to that of the solar cell based on the configuration shown in FIGS. 32 and 33, by the shorter width of first non-connecting portion 42.

The possibility of first non-connecting portion 42 being faded in print can be reduced since the overall length of first non-connecting portion 42 can be made shorter as compared to the solar cell having electrodes at the light-receiving face based on the configuration of FIGS. 32 and 33. Therefore, the electric resistance up to first connecting portion 51 from finger electrode 13b that is connected to first non-connecting portion 42 can be further reduced. As a result, the yield of solar cells is improved according to the present invention since fabrication of solar cells of low property can be suppressed.

In the configuration shown in FIG. 2, the width of first non-connecting portion 42, first connecting portion 51, and finger electrode 13b is, but not limited to, 0.3 mm, 2.5 mm, and 0.16 mm, respectively. Further, although first non-connecting portion 42 is configured by a combination of three straight portions in FIG. 2, the configuration is not limited thereto.

Figure 3:
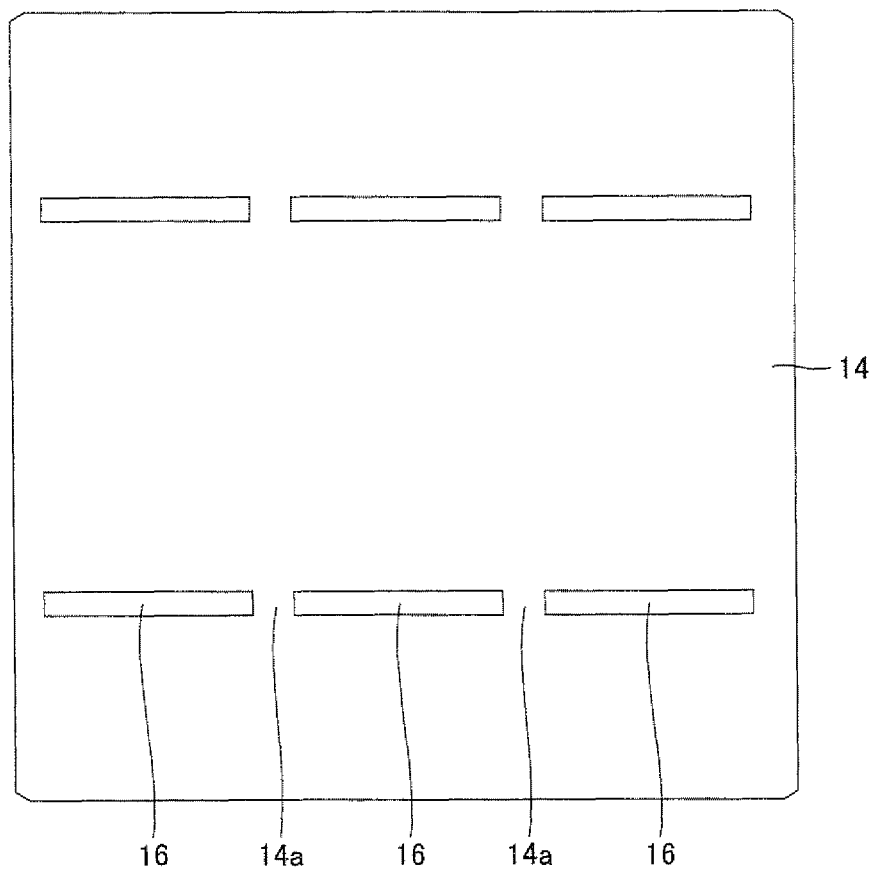
FIG. 3 is a schematic plan view of an example of a configuration of electrodes formed on a second main surface that is the back side of the solar cell of the present invention.

FIG. 3 represents a schematic plan view of an example of a configuration of electrodes formed on the second main surface that is the back side of the solar cell of the present invention.

An aluminium electrode 14 is formed nearly all over the second main surface of the solar cell of the present invention. On the region of the second main surface excluding the region where aluminium electrode 14 is formed, a straight silver electrode 16, identified as the second connecting portion that is to be connected to an interconnector, is formed extending in the horizontal direction of the drawing sheet. The region of aluminium electrode 14 located between adjacent silver electrodes 16 is a second non-connecting portion 14*a* that is not connected to an interconnector. Silver electrode 16 that is the second connecting portion and second non-connecting portion 14*a* are arranged alternately.

Figure 4:
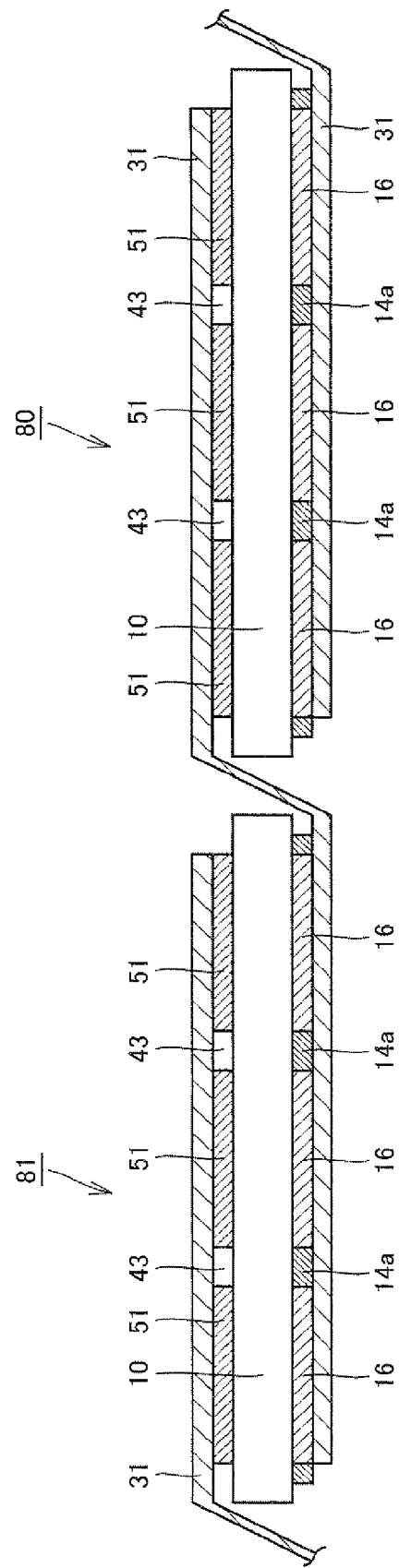
FIG. 4 is a schematic sectional view of an example of a solar cell string of the present invention, formed by connecting in series solar cells having electrodes at the light-receiving face based on the configuration of FIG. 1 face and electrodes at the back side based on the configuration of FIG. 3.
Figure 5:
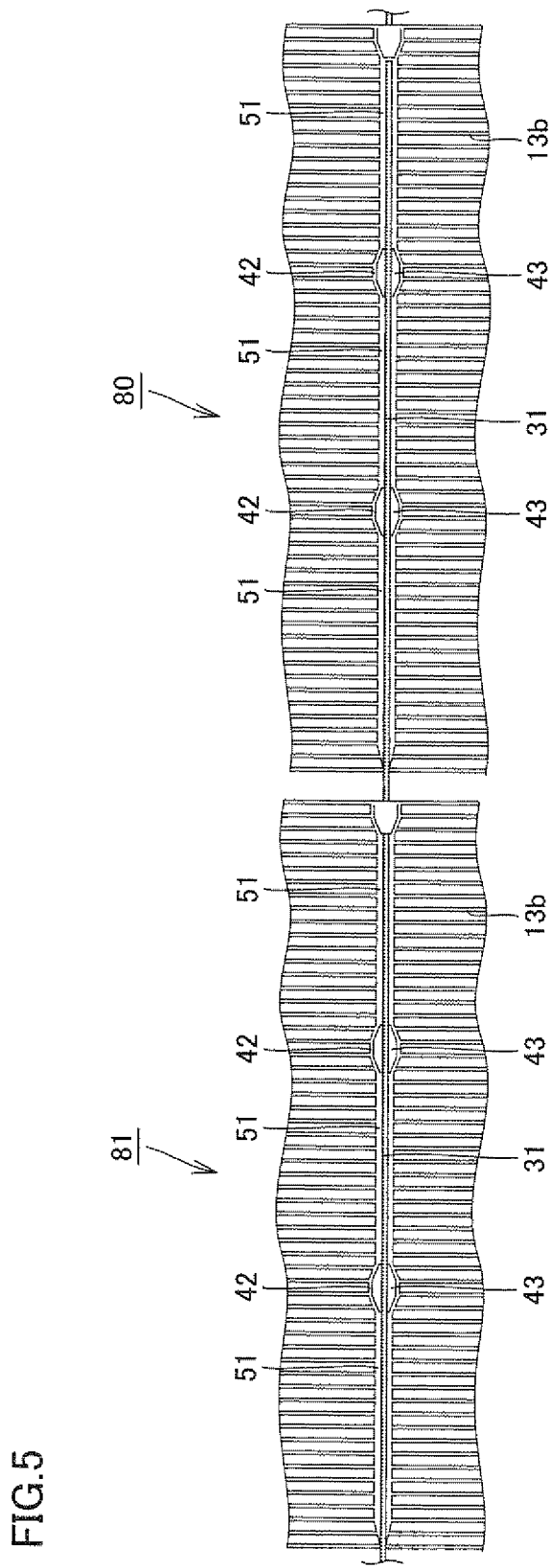
FIG. 5 is a schematic enlarged plan view of the solar cell string of FIG. 4, viewed from the light-receiving face side.

FIG. 4 is a schematic sectional view of an example of a solar cell string of the present invention, formed by connecting in series solar cells having electrodes at the light-receiving face based on the configuration shown in FIG. 1 and electrodes at the back side based on the configuration shown in FIG. 3. FIG. 5 is a schematic enlarged plan view of the solar cell string of FIG. 4, viewed from the light-receiving face side. For the sake of convenience, the n+ layer, p+ layer and anti-reflection film formed at p-type silicon substrate 10 are not depicted in FIG. 4.

In adjacent solar cells in the solar cell string of the present invention, first connecting portion 51 of a first solar cell 80 and silver electrode 16 that is the second connecting portion of a second solar cell 81 are fastened to and electrically connected to interconnector 31 by soldering or the like. In the present invention, the shape and material of the interconnector are not particularly limited, as long as the interconnector is a member having conductivity.

In the solar cell of the present invention, first connecting portion 51 and silver electrode 16 that is the second connecting portion are located symmetric about p-type silicon substrate 10 that is the semiconductor substrate.

In a solar cell string of the present invention having the above-described configuration, interconnector 31 is not connected at the region of the solar cell corresponding to inside region 43 at the light-receiving face and second non-connecting portion 14*a* at the back side.

Therefore, during the cooling step subsequent to connection of interconnector 31 in the process of fabricating a solar cell string of the present invention, the inner stress generated at the solar cell due to the difference in the thermal expansion coefficient between interconnector 31 and the solar cell can be alleviated by the region of the interconnector that is not fastened to inside region 43 and second non-connecting portion 14*a*. Thus, the warpage in the solar cell constituting the solar cell string can be reduced.

Since first connecting portion 51 fastened to interconnector 31 and silver electrode 16 that is the second connecting portion are arranged symmetric about p-type silicon substrate 10 that is the semiconductor substrate, the inner stress generated at the solar cell caused by the difference in the thermal expansion coefficient between the solar cell and interconnector 31 can be set substantially equal between the light-receiving face and the back side of the solar cell. Therefore, the warpage at the solar cell constituting a solar cell string can be further reduced.

Since the solar cell string of the present invention is formed by a solar cell having electrodes at the light-receiving face based on the configuration of FIG. 1 and electrodes at the back side based on the configuration of FIG. 3, the generation of a crack in a solar cell can be reduced at the interface section between first connecting portion 51 and inside region 43 located at the light-receiving face of the solar cell.

Figure 6:
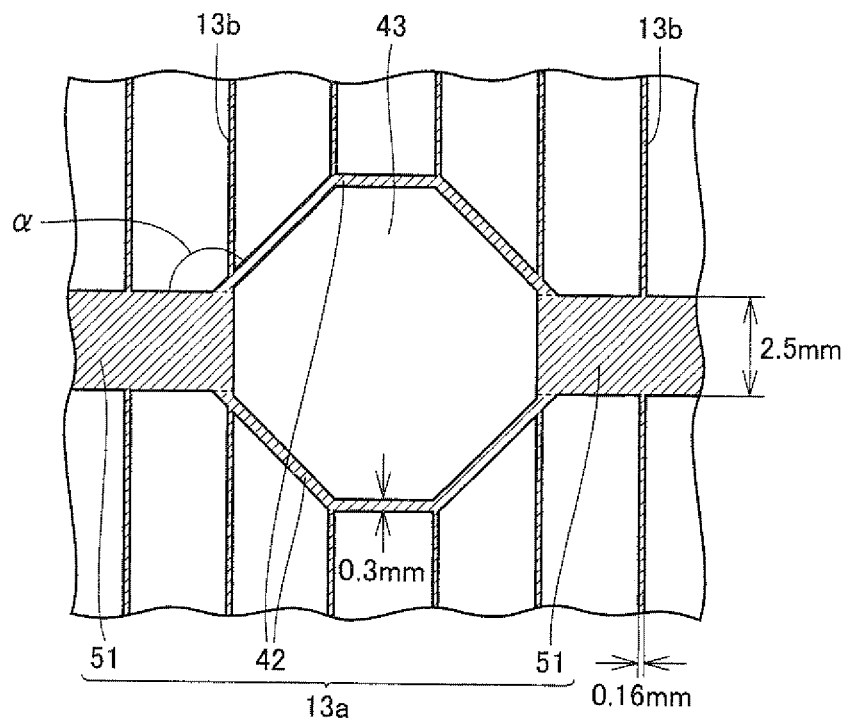
FIG. 6 is a schematic enlarged plan view of another example of a bus bar electrode, in the neighborhood of the first non-connecting portion, formed on the first main surface of the solar cell of the present invention.

FIG. 6 is a schematic enlarged plan view of another example of bus bar electrode 13*a*, in the neighborhood of first non-connecting portion 42, formed on the first main surface of the solar cell of the present invention. The configuration of FIG. 6 is characterized in that the angle α between first non-connecting portion 42 and first connecting portion 51 is approximately 135°, which is smaller than that (approximately 150°) of FIG. 2, and that first non-connecting portion 42 extends from a side face of first connecting portion 51. The configuration of FIG. 6 is prone to further reduce the warpage in the solar cell constituting the solar cell string since first non-connecting portion 42 and interconnector 31 are not fastened, and the connecting region between bus bar electrode 13*a* of the solar cell and interconnector 31 can be reduced, even in the case where the width of first connecting portion 51 and the width of interconnector 31 are identical.

Figure 7:
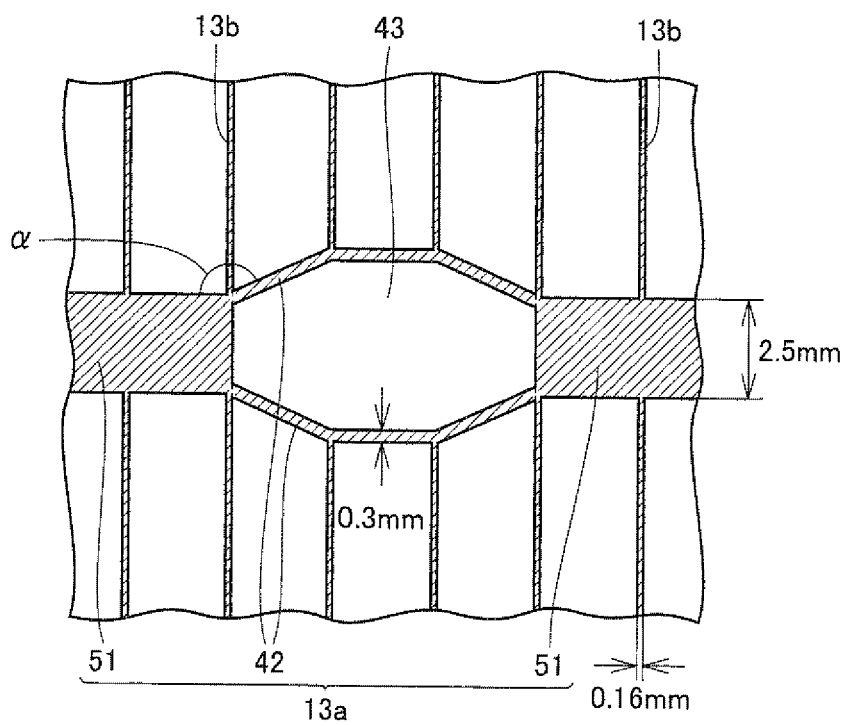
FIG. 7 is a schematic enlarged plan view of another example of a bus bar electrode, in the neighborhood of the first non-connecting portion, formed on the first main surface of the solar cell of the present invention.

FIG. 7 is a schematic enlarged plan view of another example of a bus bar electrode 13*a*, in the neighborhood of first non-connecting portion 42, formed on the first main surface of the solar cell of the present invention. The configuration of FIG. 7 is characterized in that the angle α between first non-connecting portion 42 and first connecting portion 51 is approximately 150°, and that first non-connecting portion 42 extends from an end face of first connecting portion 51. In the configuration of FIG. 7, there is a tendency of first non-connecting portion 42 not fastened to interconnector 31 when the width of interconnector 31 is set smaller than the width of first connecting portion 51. Since the connecting region between bus bar electrode 13*a* of the solar cell and interconnector 31 can be reduced, there is a tendency to further reduce warpage in the solar cells constituting the solar cell string.

Figure 8:
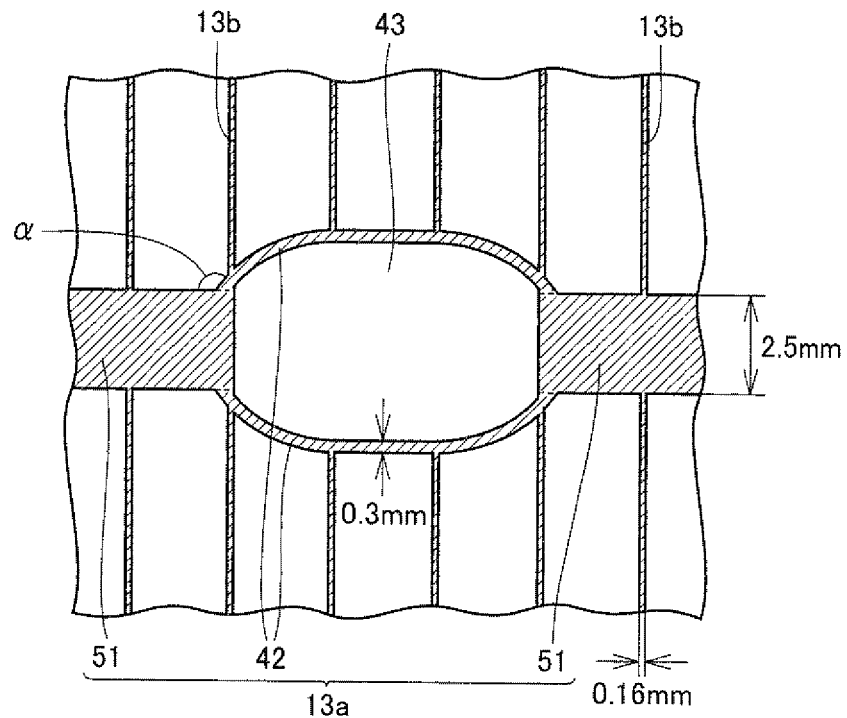
FIG. 8 is a schematic enlarged plan view of another example of a bus bar electrode, in the neighborhood of the first non-connecting portion, formed on the first main surface of the solar cell of the present invention.

FIG. 8 is a schematic enlarged plan view of another example of a bus bar electrode 13*a*, in the neighborhood of first non-connecting portion 42, formed on the first main surface of the solar cell of the present invention. The configuration of FIG. 8 is characterized in that first non-connecting portion 42 is formed including an arc portion, extending from a side face of first connecting portion 51. The configuration of FIG. 8 is prone to further reduce warpage in the solar cell constituting the solar cell string since first non-connecting portion 42 and interconnector 31 are not fastened and the connecting region between bus bar electrode 13*a* of the solar cell and interconnector 31 can be reduced, even in the case where the width of first connecting portion 51 and the width of interconnector 31 are set identical. It is apparent from the configuration of FIG. 8 that first non-connecting portion 42 and first connecting portion 51 form an angle α that is larger than 90° and smaller than 180°.

Figure 9:
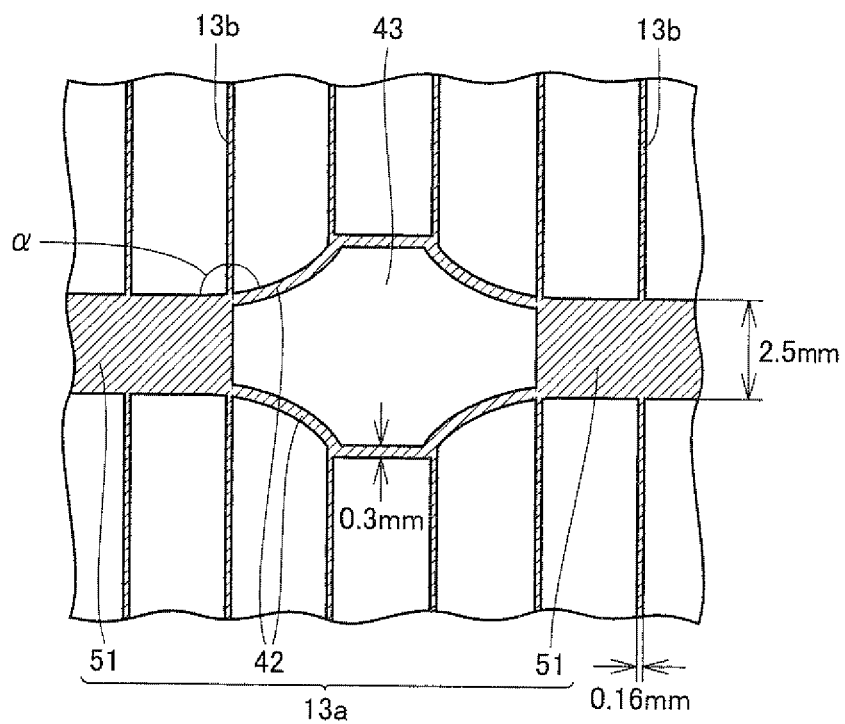
FIG. 9 is a schematic enlarged plan view of another example of a bus bar electrode, in the neighborhood of the first non-connecting portion, formed on the first main surface of the solar cell of the present invention.

FIG. 9 is a schematic enlarged plan view of another example of a bus bar electrode 13*a*, in the neighborhood of first non-connecting portion 42, formed on the first main surface of the solar cell of the present invention. The configuration of FIG. 9 is characterized in that first non-connecting portion 42 is formed including an arc portion, extending from an end face of first connecting portion 51. The configuration of FIG. 9 is prone to further reduce warpage in the solar cell constituting the solar cell string since first non-connecting portion 42 and interconnector 31 are not fastened and the connecting region between bus bar electrode 13*a* of the solar cell and interconnector 31 can be reduced in the case where the width of first connecting portion 51 is set larger than the width of interconnector 31. It is apparent from the configuration of FIG. 9 that first non-connecting portion 42 and first connecting portion 51 form an angle α that is larger than 90° and smaller than 180°.

Figure 10:
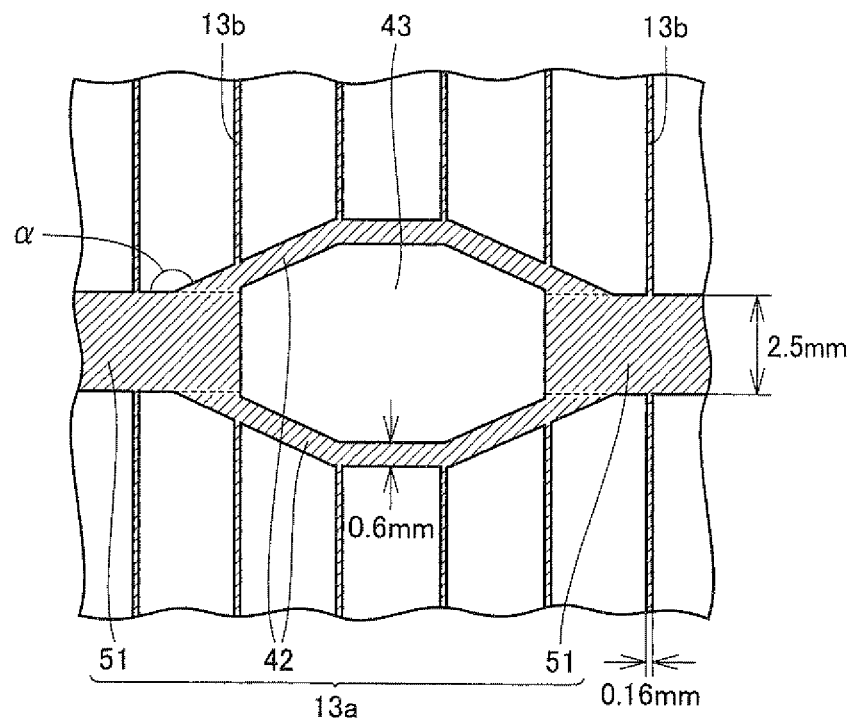
FIG. 10 is a schematic enlarged plan view of another example of a bus bar electrode, in the neighborhood of the first non-connecting portion, formed on the first main surface of the solar cell of the present invention.

FIG. 10 is a schematic enlarged plan view of another example of a bus bar electrode 13a, in the neighborhood of first non-connecting portion 42, formed on the first main surface of the solar cell of the present invention. The configuration of FIG. 10 is characterized in that the width of first non-connecting portion 42 is 0.6 mm, which is two times that (0.3 mm) of the configuration of FIG. 2. The configuration of FIG. 10 is prone to reduce the electrical resistance at first non-connecting portion 42 due to the larger width of first non-connecting portion 42.

It is preferable to set the cross-sectional area of first non-connecting portion 42 (the area of the cross section in the direction orthogonal to the longitudinal direction of first non-connecting portion 42) to be not more than ½ the cross-sectional area of first connecting portion 51 (the area of the cross section in the direction orthogonal to the longitudinal direction of first connecting portion 51). This is because, if the cross-sectional area of first non-connecting portion 42 (the area of the cross section in the direction orthogonal to the longitudinal direction of first non-connecting portion 42) is set larger than ½ the cross-sectional area of first connecting portion 51 (the area of the cross section in the direction orthogonal to the longitudinal direction of first connecting portion 51), the amount of electrode material used cannot be reduced as compared to the case where bus bar electrode 13a is formed of first connecting portion 51 alone, absent of first non-connecting portion 42.

In the configuration of FIG. 10, the angle α between first non-connecting portion 42 and first connecting portion 51 is approximately 150°.

Figure 11:
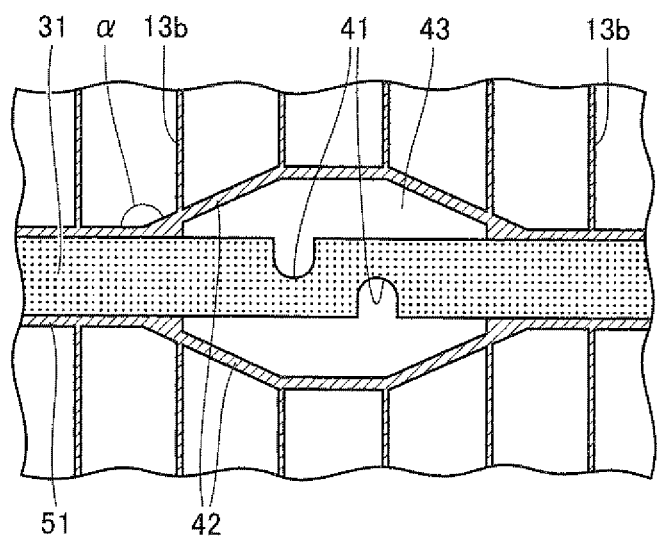
FIG. 11 is a schematic enlarged plan view corresponding to an exemplified state of an interconnector having a configuration different from that of the interconnector of FIG. 5, electrically connected to the electrodes at the light-receiving face based on the configuration shown in FIG. 1.

FIG. 11 is a schematic enlarged plan view corresponding to an exemplified state of an interconnector having a configuration different from that of the interconnector of FIG. 5, electrically connected to the electrodes at the light-receiving face based on the configuration shown in FIG. 1. Interconnector 31 of FIG. 11 has small notches formed, constituting a small cross-sectional area section 41. In FIG. 11, small cross-sectional area section 41 of interconnector 31 is located at a site corresponding to inside region 43. In the present invention, a "small cross-sectional area section" refers to the section of the interconnector where the area of the cross section orthogonal to the longitudinal direction is locally reduced.

Figure 12:
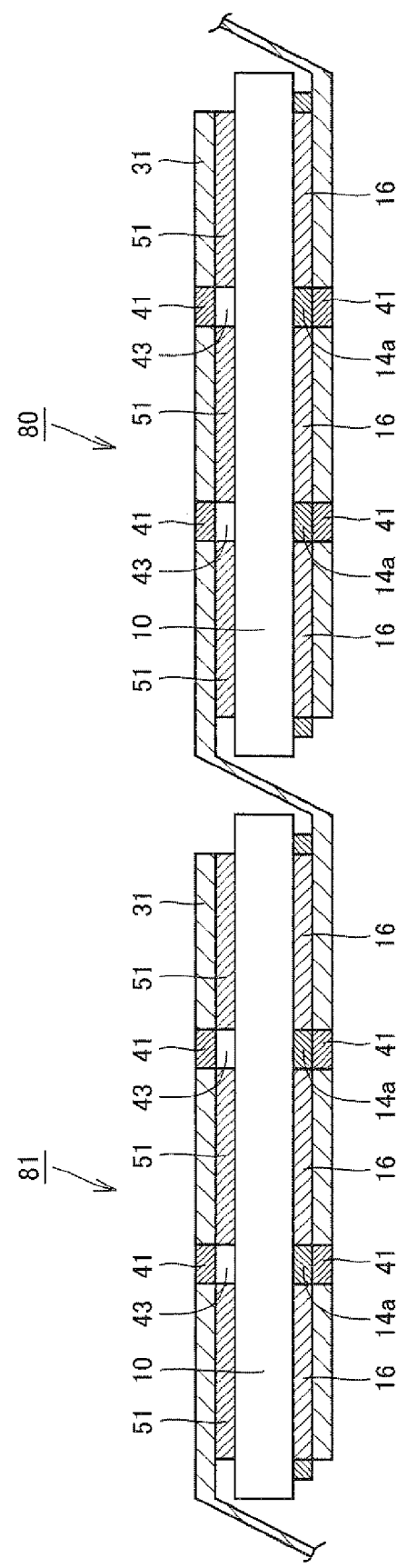
FIG. 12 is a schematic sectional view of an example of a solar cell string formed by electrically connecting in series a plurality of solar cells having electrodes at the light-receiving face based on the configuration of FIG. 1 and electrodes at the back side based on the configuration of FIG. 3, by means of the interconnector of FIG. 11.

FIG. 12 is a schematic sectional view of an example of a solar cell string formed by electrically connecting in series a plurality of solar cells having the electrodes at the light-receiving face based on the configuration of FIG. 1 and the electrodes at back side based on the configuration shown in FIG. 3, using interconnector 31 of FIG. 11.

The solar cell string of FIG. 12 has first connecting portion 51 of first solar cell 80 and silver electrode 16 that is the second connecting portion of second solar cell 81, adjacent to each other, electrically connected by interconnector 31. Interconnector 31 is bent between first solar cell 80 and second solar cell 81. Small cross-sectional area section 41 of interconnector 31 is located at all the sites corresponding to each inside region 43 and each second non-connecting portion 14a.

By connecting interconnector 31 such that small cross-sectional area section 41 of interconnector 31 is located at at least one of the sites corresponding to inside region 43 and second non-connecting portion 14a, preferably located at all the sites, the advantage of further alleviating the stress by the elongation of small cross-sectional area section 41 that is relatively low in strength as compared to other portions of interconnector 31 is provided, in addition to the aforementioned reduction in stress. Specifically, in the case where small cross-sectional area section 41 of interconnector 31 is located corresponding to both inside region 43 and second non-connecting portion 14a, arbitrary deformation is allowed since small cross-sectional area section 41 is not fastened and takes a free state. The stress alleviation effect by the elongation can be exhibited sufficiently. In this case, generation of a crack in the solar cell can be reduced significantly at the interface section between first connecting portion 51 and inside region 43 at the light-receiving face of the solar cell caused by the warpage occurring at the solar cell during a cooling step subsequent to interconnector connection.

Figure 13:
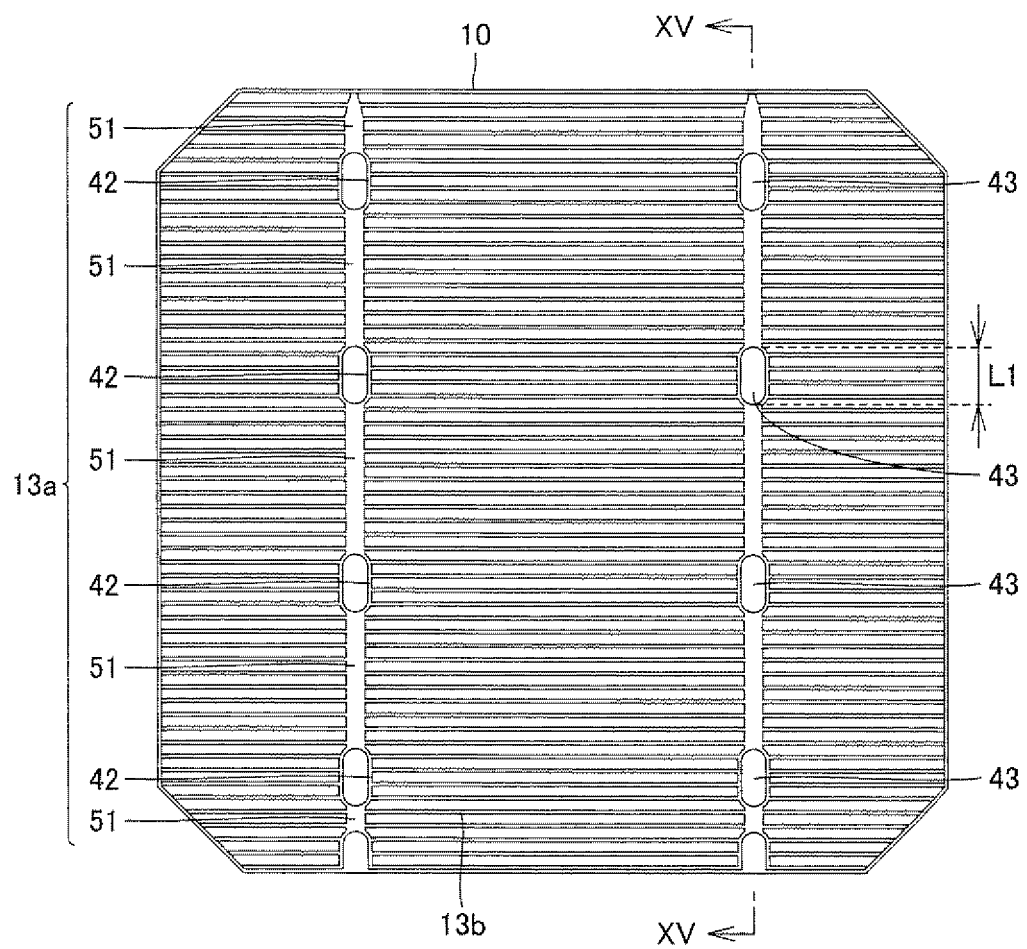
FIG. 13 is a schematic plan view of a light-receiving face identified as a first main surface of an example of a solar cell of the present invention.

FIG. 13 is a schematic plan view of a light-receiving face that is the first main surface according to an example of a solar cell of the present invention. The solar cell employs a p-type single crystal silicon for the material of p-type silicon substrate 10, including a linear bus bar electrode 13a of a relatively large width, extending vertically in the drawing sheet, and a plurality of linear finger electrodes 13b of small width, extending in the horizontal direction in the drawing sheet from bus bar electrode 13a, at the first main surface of p-type silicon substrate 10 that is the light-receiving face of the solar cell.

Bus bar electrode 13a includes first connecting portion 51 fastened to and electrically connected to an interconnector, and a first non-connecting portion 42 not connected to an interconnector. First connecting portions 51 and first non-connecting portion 42 are arranged alternately along the longitudinal direction of bus bar electrode 13a. The electrodes at the light-receiving face of FIG. 13 are configured such that at least one of first connecting portions 51 adjacent to an end of the first main surface of p-type silicon substrate 10 is disposed apart from the end of the first main surface.

First non-connecting portion 42 extends from a side face of first connecting portion 51. First non-connecting portion 42 and first connecting portion 51 form an angle α larger than 90° and smaller than 180°. On the first main surface is also provided an inside region 43 that is a void, adjacent to an end face of first connecting portion 51 and a side face of first non-connecting portion 42.

Figure 14:
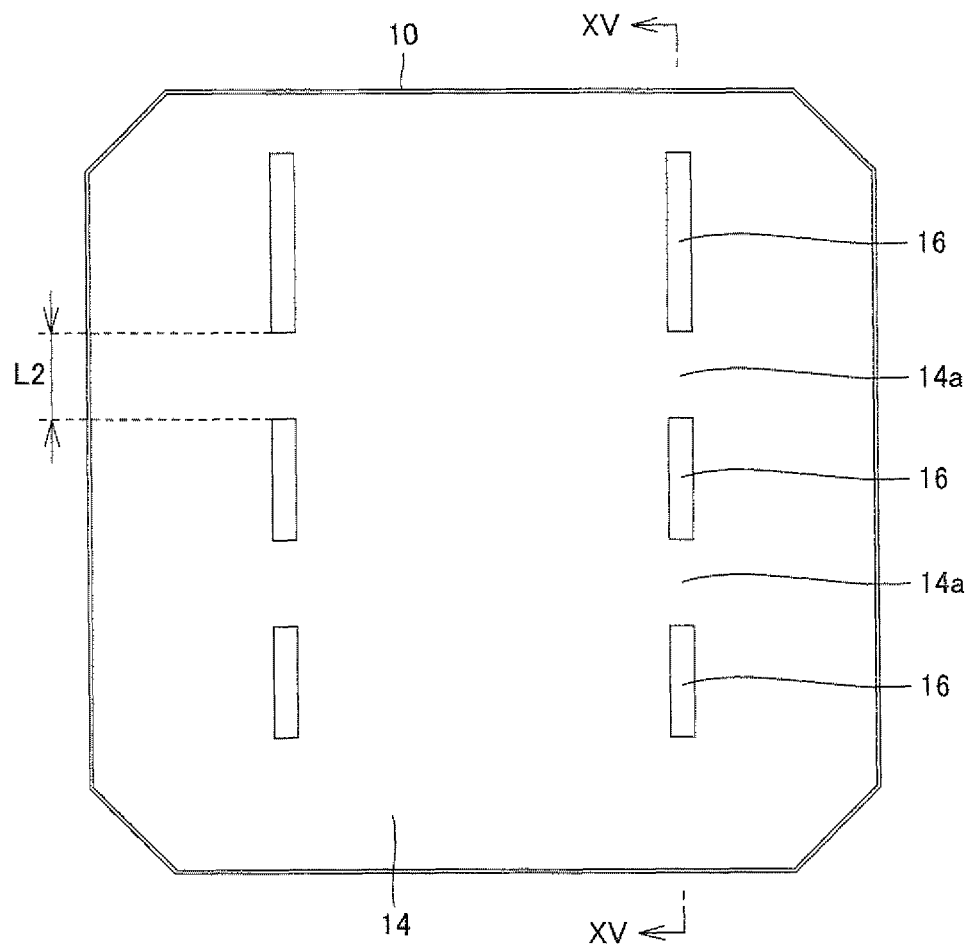
FIG. 14 is a schematic plan view of the back side identified as a second main surface of the solar cell of FIG. 13.

FIG. 14 is a schematic plan view of the back side of the solar cell of FIG. 13, corresponding to the second main face. At the second main face of p-type silicon substrate 10 identified as the back side of the solar cell of the present invention, silver electrode 16 that is the second connecting portion for connection to an interconnector, and second non-connecting portion 14a not connected to an interconnector, are formed alternately. Second non-connecting portion 14a is formed of aluminium electrode 14 between adjacent silver electrodes 16 in the longitudinal direction of silver electrode 16 that is the second connecting portion.

The solar cell is characterized in that, as shown in FIG. 13, the surface contour of inside region 43 corresponds to a track shape with an arc shape at the leading end located at the side of first connecting portion 51 (semi-circles at both ends, joined by two straight segments).

This is based on the findings made by the inventors as a result of diligent research. Namely, generation of a crack in a solar cell caused by the warpage occurring at the solar cell during a cooling step subsequent to interconnector connection in the fabrication of a solar cell string can be reduced at the interface section between first connecting portion 51 and inside region 43 at the light-receiving face of the solar cell by forming the interface section between first connecting portion 51 and inside region 43 in an arc shape. Although the reason thereof is not definite, it is considered that the stress received at the interface section between first connecting portion 51 and inside region 43 of the solar cell is dispersed when warpage occurs at the solar cell during the cooling step subsequent to interconnector connection by forming the interface section between first connecting portion 51 and inside region 43 in an arc shape.

Figure 15:
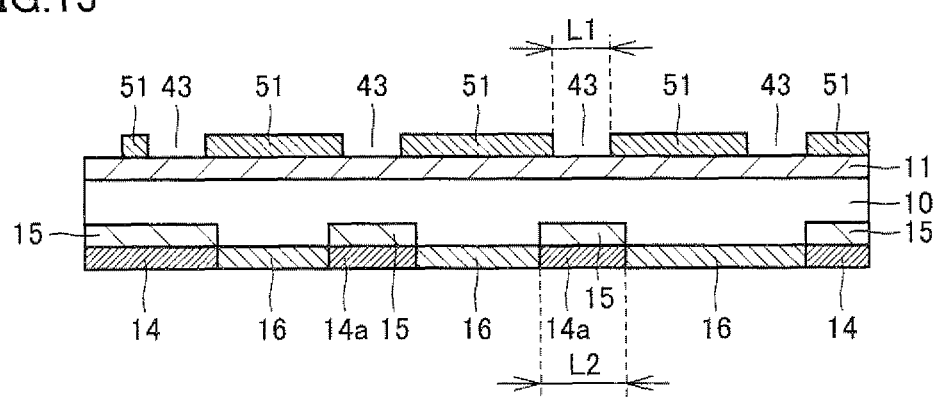
FIG. 15 is a schematic plan view taken along line XV-XV of FIGS. 13 and 14.

FIG. 15 is a schematic sectional view taken along line XV-XV of FIGS. 13 and 14. As shown in FIGS. 13 to 15, a length L1 of inside region 43 in the direction of arrangement of first connecting portion 51 and first non-connecting portion 42 (the vertical direction in the drawing sheet of FIG. 1) is preferably shorter than a length L2 of a companion second non-connecting portion 14a in the direction of arrangement of the second connecting portion and second non-connecting portion 14a (vertical direction in the drawing sheet of FIG. 2).

This is based on the findings made by the inventors as a result of diligent research. Namely, generation of a crack at the interface between first connecting portion 51 and inside region 43 at the light-receiving face of the solar cell constituting the solar cell string can be further reduced by setting length L1 of inside region 43 shorter than length L2 of second non-connecting portion 14a located opposite to inside region 43 with p-type silicon substrate 10 therebetween. It is considered that the generation of a crack in the solar cell can be further reduced at the interface section between first connecting portion 51 and inside region 43 at the light-receiving face of the solar cell when warpage occurs at the solar cell during a cooling step subsequent to interconnector connection since aluminium constituting second non-connecting portion 14a that is longer than inside region 43 serves to provide a reinforcing effect.

The advantage set forth above can be obtained as long as at least one set of inside region 43 and second non-connecting portion 14a is located facing each other with p-type silicon substrate 10 therebetween, and at least one of the sets of inside region 43 and second non-connecting portion 14a facing each other is provided such that a length L1 of inside region 43 is shorter than a length L2 of second non-connecting portion 14a.

The solar cell of the present invention may include a portion where second non-connecting portion 14a is not formed at the location symmetric to the location where inside region 43 is formed about p-type silicon substrate 10, as shown in the right end of FIG. 15.

Figure 16:
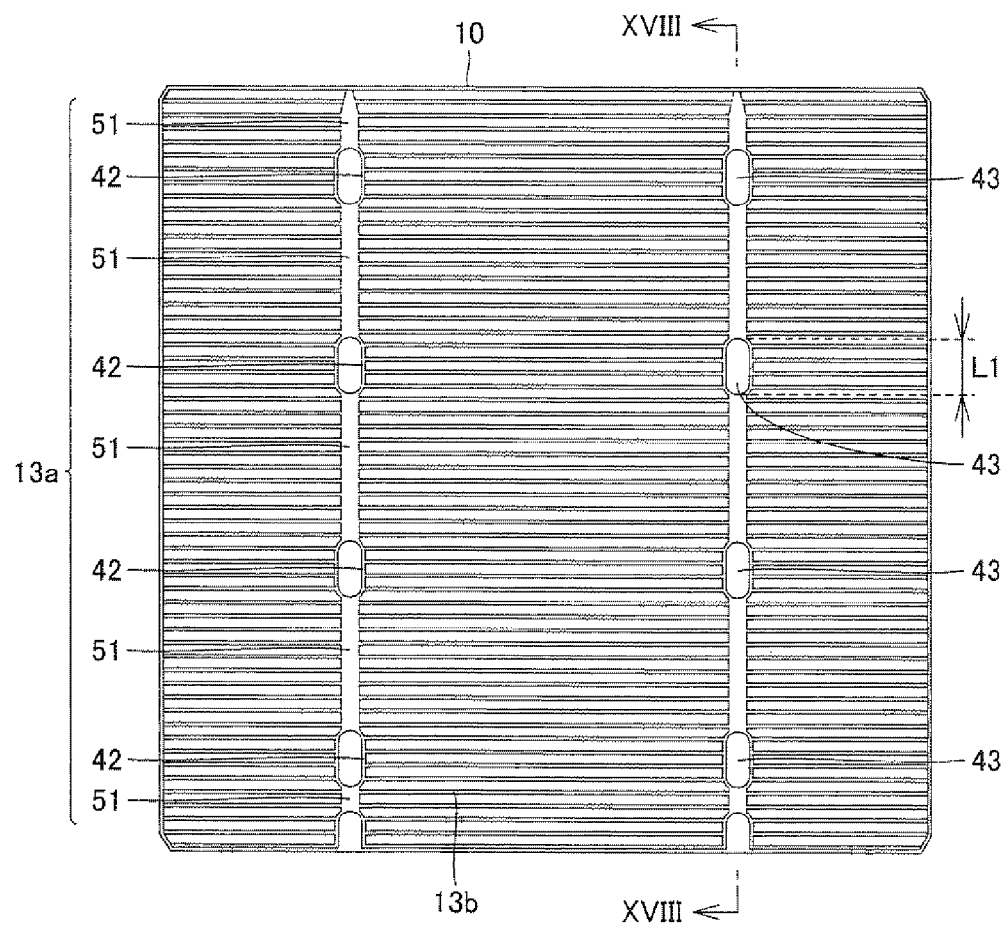
FIG. 16 is a schematic plan view of a light-receiving face identified as a first main surface of another example of a solar cell of the present invention.
Figure 17:
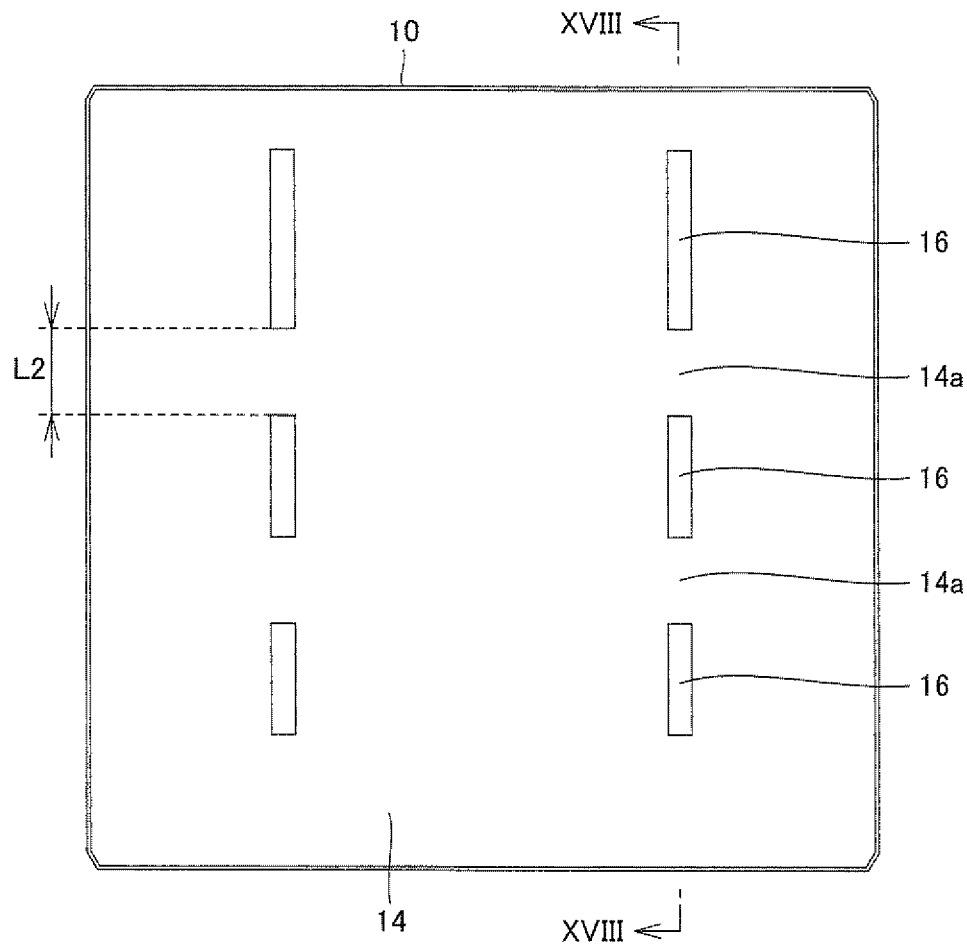
FIG. 17 is a schematic plan view of the back side of the solar cell of FIG. 16, identified as a second main surface.
Figure 18:
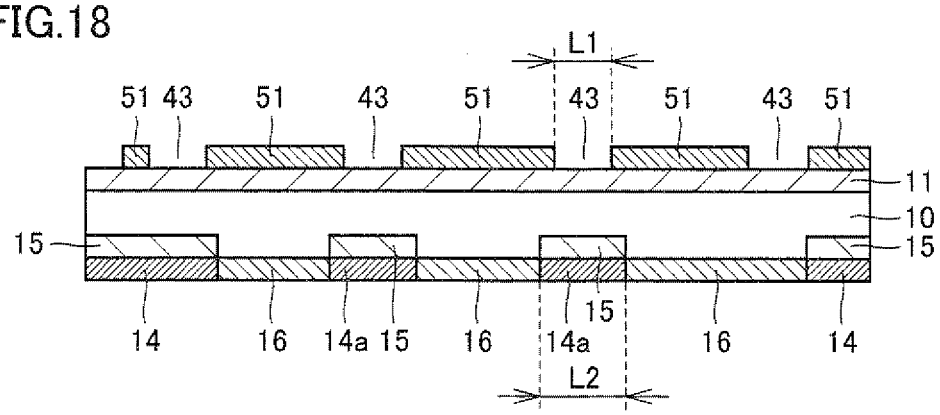
FIG. 18 is a schematic sectional view taken along line XVIII-XVIII of FIGS. 16 and 17.

FIG. 16 is a schematic plan view of the light-receiving face that is the first main surface of another example of a solar cell of the present invention. FIG. 17 is a schematic plan view of the back side that is the second main surface of the solar cell of FIG. 16. FIG. 18 is schematic sectional view taken along line XVIII-XVIII of FIGS. 16 and 17. The solar cell is characterized in that p-type polycrystalline silicon is employed for the material of p-type silicon substrate 10. The remaining elements are similar to those set forth above.

Figure 19:
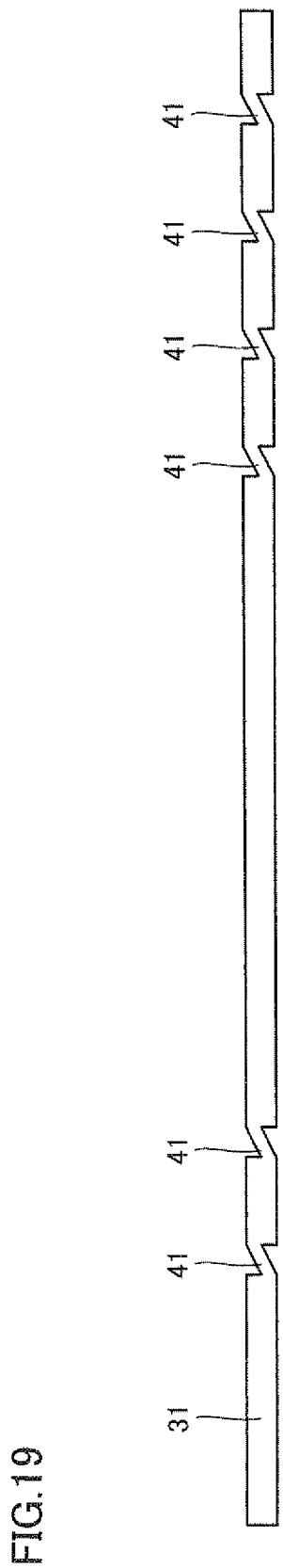
FIG. 19 is a schematic plan view of an example of an interconnector employed in a solar cell string of the present invention.

FIG. 19 is a schematic plan view of an example of an interconnector employed in the solar cell string of the present invention. Interconnector 31 includes a plurality of small cross-sectional area sections 41 whose area of a cross section perpendicular to the longitudinal direction of interconnector 31 is locally reduced.

Figure 20:
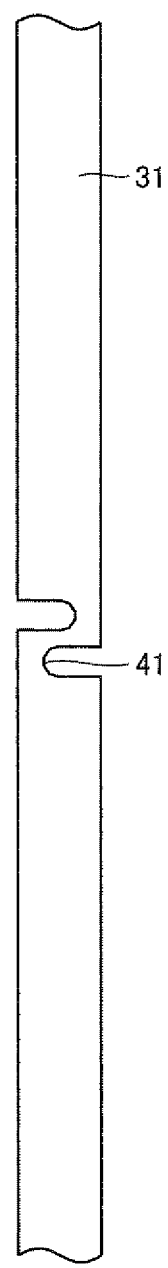
FIG. 20 is a schematic plan view of another example of an interconnector employed in the present invention.
Figure 21:
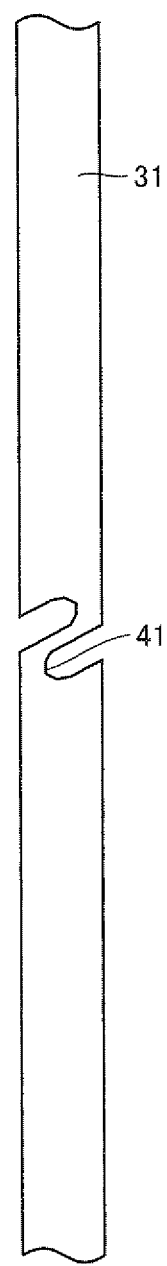
FIG. 21 is a schematic plan view of another example of an interconnector employed in the present invention.
Figure 22:
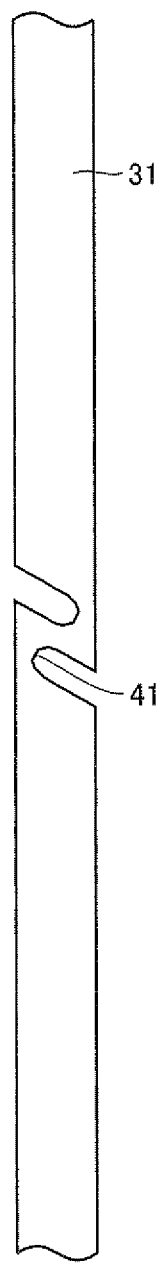
FIG. 22 is a schematic plan view of another example of an interconnector employed in the present invention.

Each of FIGS. 20-22 is a schematic plan view of other examples of an interconnector employed in the present invention. Each interconnector 31 has a small cross-sectional area section 41 with the cross-sectional area of interconnector 31 reduced locally.

Figure 23:
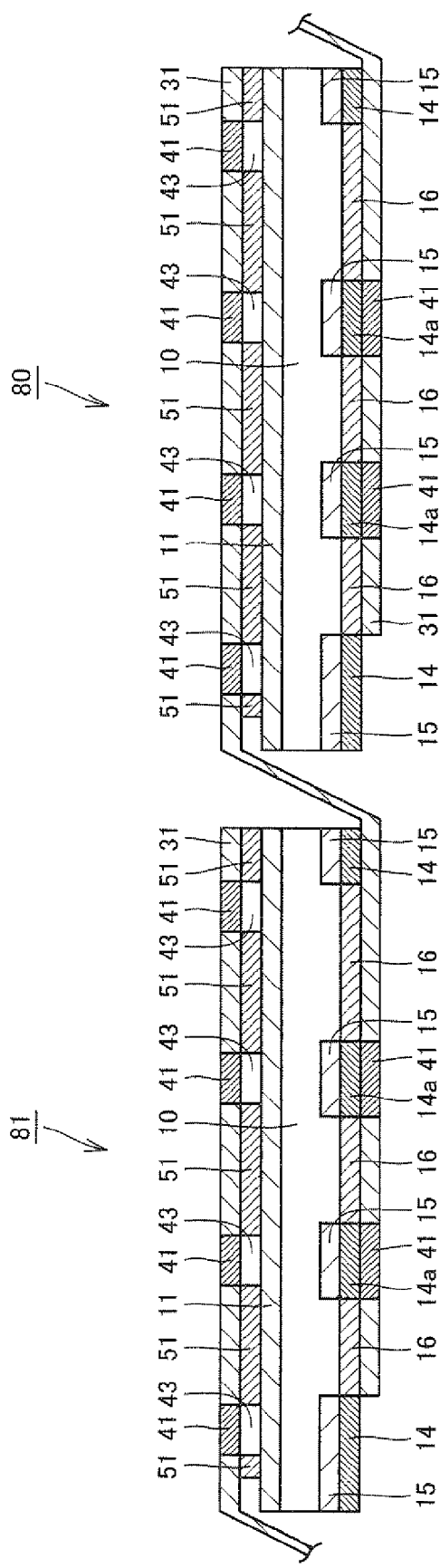
FIG. 23 is a schematic sectional view of an example of a solar cell string of the present invention, formed by connecting in series solar cells having the light-receiving face of FIG. 13 and the back side of FIG. 14.
Figure 24:
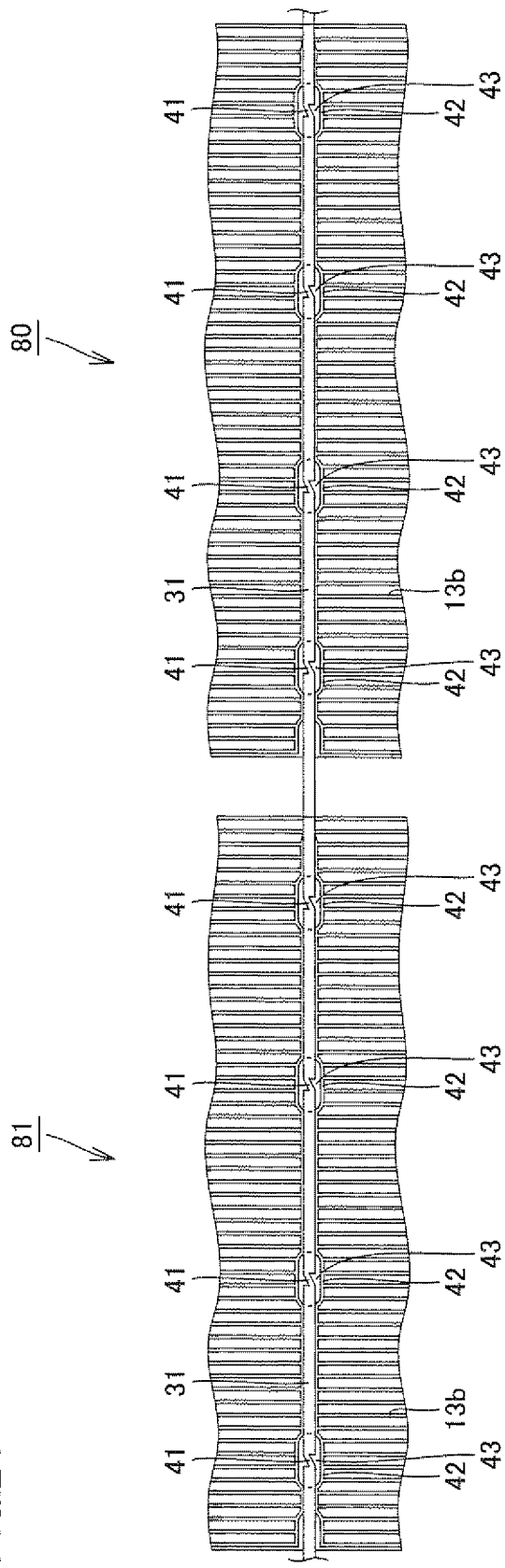
FIG. 24 is a schematic enlarged plan view of the solar cell string of FIG. 23, viewed from the light-receiving face side.

FIG. 23 is a schematic sectional view of an example of a solar cell string of the present invention, formed by connecting in series a solar cell having the light-receiving face shown in FIG. 13 and the back side shown in FIG. 14. FIG. 24 is a schematic enlarged plan view of the solar cell string of FIG. 23, viewed from the light-receiving face side.

Interconnector 31 formed of one conductive member has one end fastened and connected to first connecting portion 51 of a first solar cell 80 and the other end fastened and connected to silver electrode 16 that is the second connecting portion of a second solar cell 81. Interconnector 31 has small cross-sectional area section 41 arranged at inside region 43 at the light-receiving face of first solar cell 80 and at second non-connecting portion 14a at the back side of second solar cell 81. Inside region 43 and second non-connecting portion 14a of the solar cell are not fastened and connected to interconnector 31. Interconnector 31 is bent between first solar cell 80 and second solar cell 81. In FIG. 23, the anti-reflection film is not depicted.

Since the surface contour of inside region 43 of the solar cell takes an arc shape at the leading ends located at the side of first connecting portions 51 in the solar cell string of the present invention, generation of a crack in a solar cell at an interface section between first connecting portion 51 and inside region 43 at the light-receiving face of the solar cell can be reduced when warpage occurs at the solar cell during a cooling step subsequent to interconnector connection, as compared to a solar cell having the surface contour of inside region 43 as shown in FIGS. 32 and 33, absent of an arc shape for the leading end located at the side of first connecting portion 51.

Since interconnector 31 is not connected to first non-connecting portion 42, inside region 43 and second non-connecting portion 14a of the solar cell corresponding to the configuration set forth above in the solar cell string of the present invention, the length of connection of interconnector 31 with first connecting portion 51 and silver electrode 16 that is the second connecting portion of the solar cell can be shortened. In the case where the connecting length of interconnector 31 with respect to first connecting portion 51 and silver electrode 16 that is the second connecting portion of the solar cell is shortened, the stress generated by the difference in the thermal expansion coefficient between interconnector 31 and p-type silicon substrate 10 constituting a solar cell can be reduced. Therefore, generation of a crack in a solar cell at an interface section between first connecting portion 51 and inside region 43 at the light-receiving face of the solar cell caused by the warpage occurring at the solar cell during a cooling step subsequent to interconnector connection can be further reduced.

Furthermore, by connecting interconnector 31 such that small cross-sectional area section 41 of interconnector 31 is located at at least one site corresponding to inside region 43 and second non-connecting portion 14a, preferably at all the sites, the advantage of further alleviating the stress by the elongation of small cross-sectional area section 41 where the strength is relatively low as compared to other portions of interconnector 31 can be provided, in addition to the aforementioned advantage of reducing the stress. Specifically, in the case where small cross-sectional area section 41 of interconnector 31 is located corresponding to both inside region 43 and second non-connecting portion 14a, arbitrary deformation is allowed since small cross-sectional area section 41 is not fastened and takes a free state. The stress alleviation effect by the elongation can be exhibited sufficiently. In this case, generation of a crack in the solar cell caused by the warpage occurring at the solar cell during a cooling step subsequent to interconnector connection can be reduced significantly at the interface section between first connecting portion 51 and inside region 43 at the light-receiving face of the solar cell.

Figure 25:
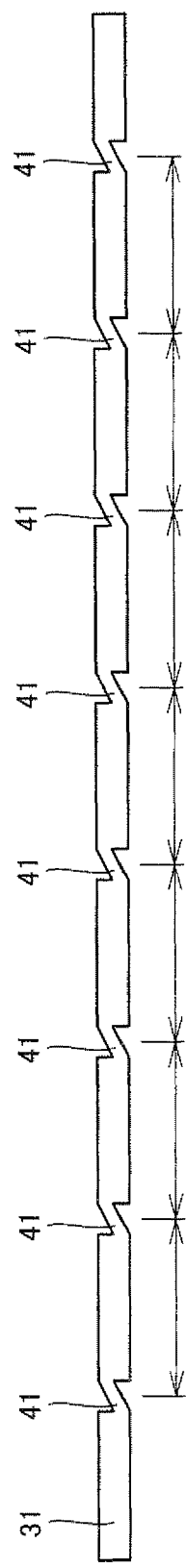
FIG. 25 is a schematic plan view of another example of an interconnector employed in the present invention.
Figure 26:
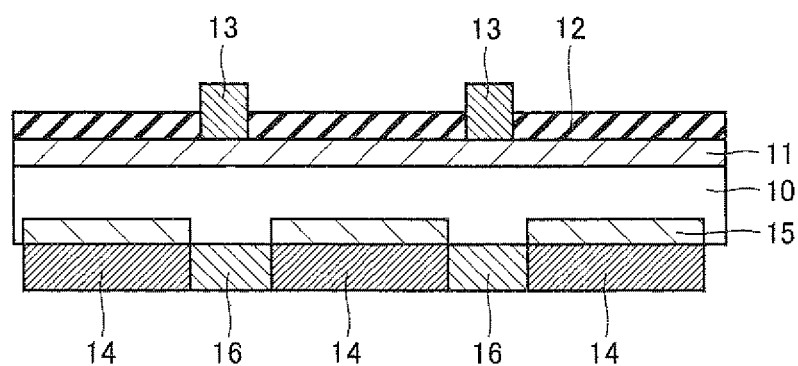
FIG. 26 is a schematic sectional view of an example of a conventional solar cell.
Figure 27:
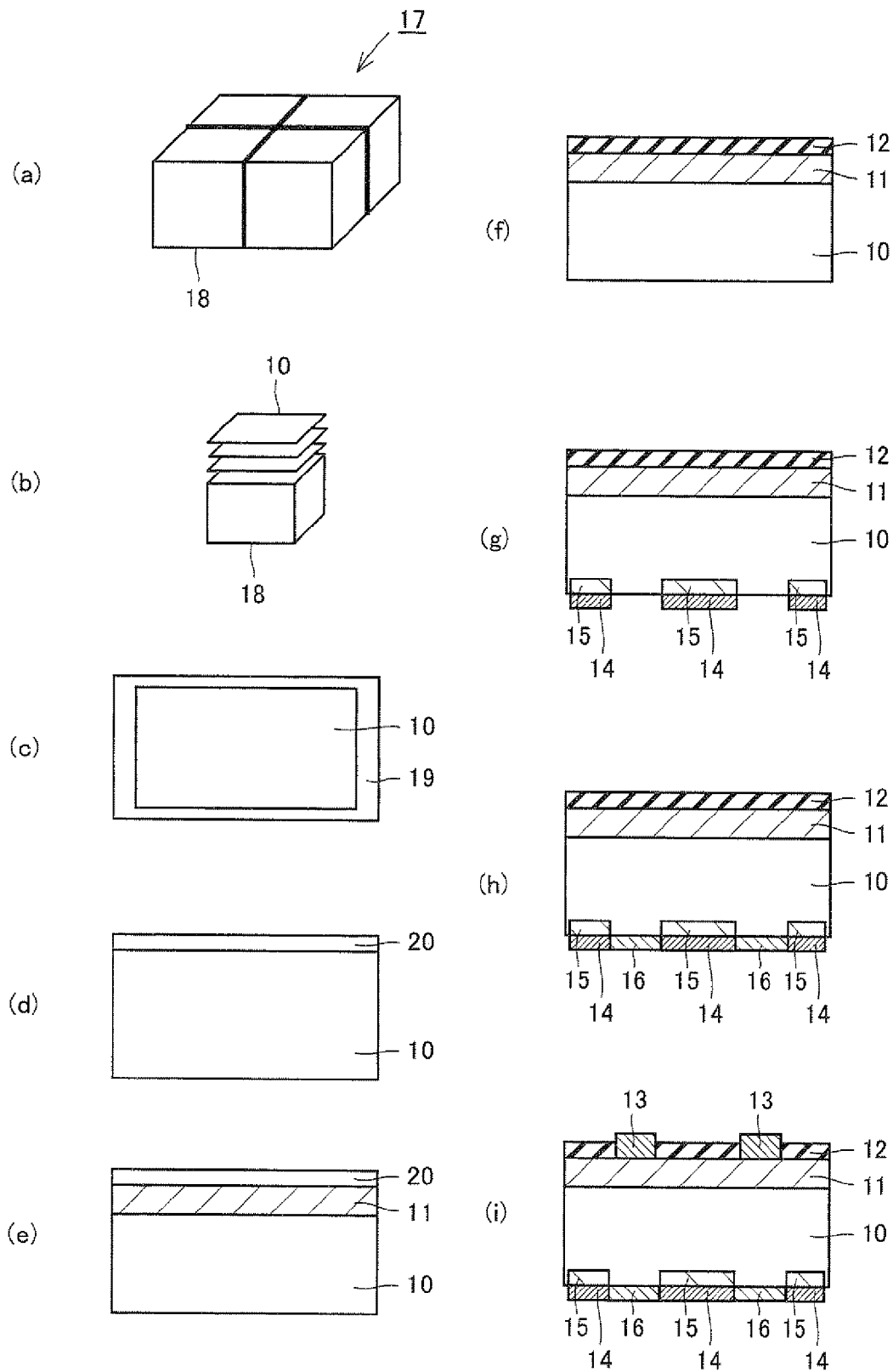
FIG. 27 is a diagram to illustrate an example of a fabrication method of a conventional solar cell.
Figure 28:
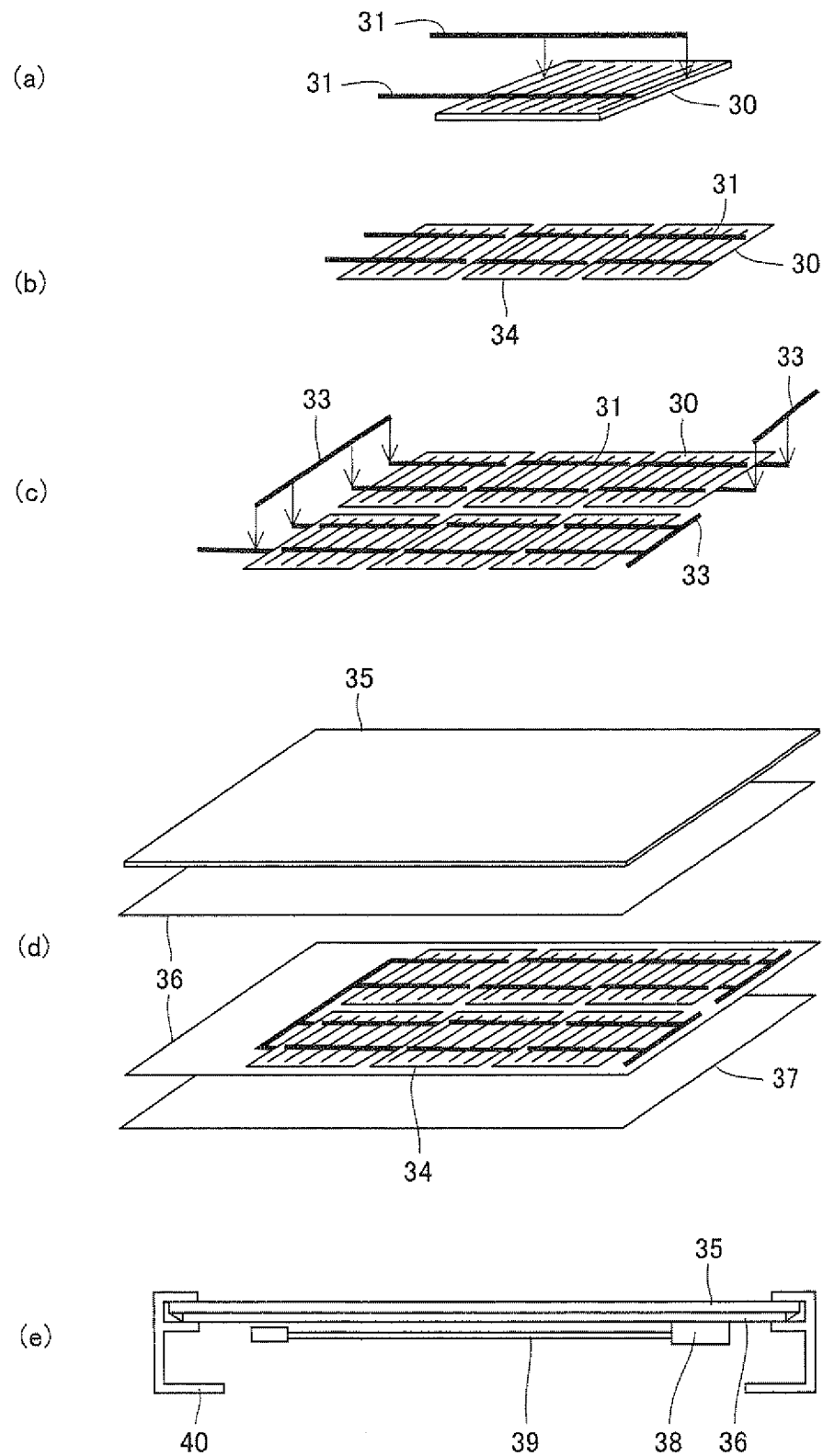
FIG. 28 is a diagram to illustrate an example of a fabrication method of a conventional solar cell module.
Figure 29:
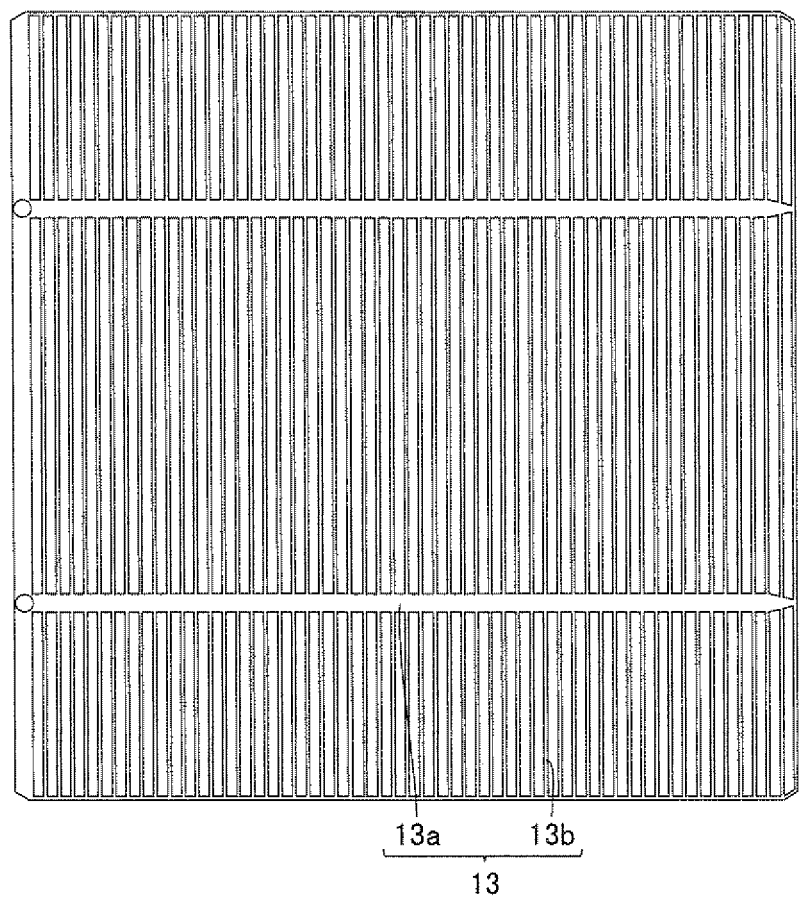
FIG. 29 is a schematic plan view of a configuration of a silver electrode formed on a first main surface of a p-type silicon substrate that is the light-receiving face of the solar cell of FIG. 26.
Figure 30:
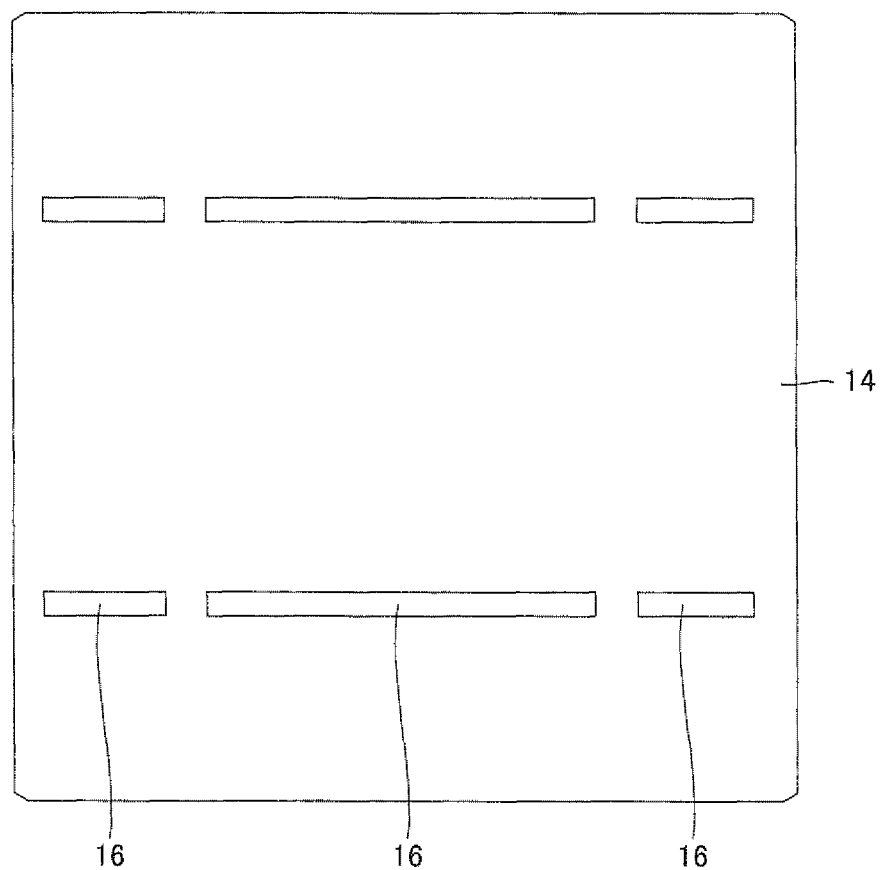
FIG. 30 is a schematic plan view of a configuration of an aluminium electrode and silver electrode formed on a second main surface of a p-type silicon substrate that is the back side of the solar cell of FIG. 26.
Figure 31:
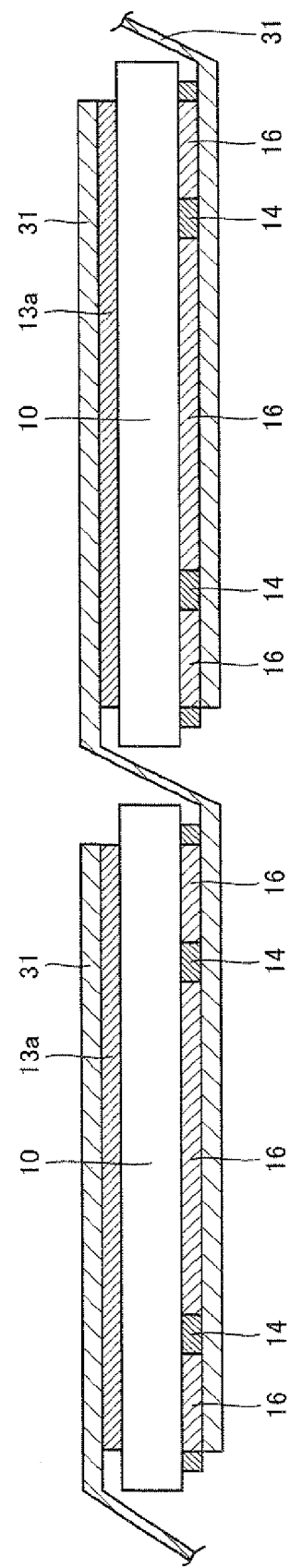
FIG. 31 is a schematic sectional view of a solar cell string having solar cells of the configuration of FIG. 26 connected in series.

Although a solar cell string is formed using an interconnector of FIG. 19 in the above embodiment, a solar cell string may be formed using an interconnector 31 shown in the schematic plan view of FIG. 25, having small cross-sectional area sections 41 formed equally spaced. Since formation of small cross-sectional area section 41 is facilitated in the case where a solar cell string is produced employing such an interconnector having small cross-sectional area section 41 adjacent to each other spaced equally apart, the fabrication cost of the solar cell string can be reduced, allowing improvement in the productivity of the solar cell string.

By sealing the above-described solar cell string of the present invention with a sealant such as an EVA according to well-known conventional methods, a solar cell module of the present invention can be produced.

Elements other than those described above are similar to, but not restricted to, those set forth in the section of the Background Art. For example, in the present invention, a semiconductor substrate other than a single crystal or polycrystal p-type silicon substrate may be used. Further, the p-type and n type conductivity can be exchanged in the description provided in the section of the Background Art. Further, the first connecting portion, first non-connecting portion, and second connecting portion do not necessarily have to be silver electrodes. Moreover, the second non-connecting portion does not necessarily have to be an aluminium electrode, and the inside region does not necessarily have to be a void in the present invention.

The above embodiment was described in which the surface contour of inside region 43 takes a track shape. From the standpoint of further reducing generation of a crack in the solar cell at an interface section between first connecting portion 51 and inside region 43 at the light-receiving face of the solar cell constituting a solar cell string, the surface contour of inside region 43 preferably takes a circle, an ellipse, or a track shape corresponding to an arc at the leading ends located at the side in contact with first connecting portions 51.

It should be understood that the embodiments disclosed hereinafter are illustrative and nonrestrictive in every respect. The scope of the present invention is defined by the terms of the claims, rather than the description above, and is intended to include any modification within the scope and meaning equivalent to the scope of the claims.

Industrial Applicability

According to the present invention, there can be provided a solar cell, a solar cell string, and a solar cell module that can have the generation of a crack in a solar cell reduced when warpage occurs at the solar cell during a cooling step subsequent to interconnector connection.

The invention claimed is:

1. A solar cell comprising:
a semiconductor substrate having a photoelectric converting portion,
a first electrode formed on a first main surface of said semiconductor substrate, and
a second electrode connected to said first electrode on said first main surface,
wherein
said first electrode includes a plurality of spaced-apart first connecting portions connected to an interconnector, and a first non-connecting portion not directly connected to said interconnector, and a plurality of finger electrodes directly connected to the first connecting portions and to the first non-connecting portion, said first connecting portions have longitudinal axes longitudinally aligned on a first common axis,
said interconnector having a longitudinal axis longitudinally aligned on said first common axis,
said first non-connecting portion is arranged to extend between axially adjacent two of said spaced-apart first connecting portions, electrically connecting said axially adjacent first connecting portions together, said finger electrodes having longitudinal axes disposed perpendicular to said first common axis,
said first connecting portions each having a length along said first common axis greater than a length of said first non-connecting portion arranged to extend therebetween, and
said axially adjacent first connecting portions and said first non-connecting portion are coupled forming an outer angle larger than 90° and smaller than 180° with respect to the longitudinal axis of each respective first connecting portion.

2. The solar cell according to claim 1, wherein said first non-connecting portion extends from a longitudinal end face of said first connecting portion.

3. The solar cell according to claim 1, wherein said first non-connecting portion extends from a side face of said first connecting portion.

4. The solar cell according to claim 1, wherein said first non-connecting portion is formed of a combination of straight portions.

5. The solar cell according to claim 1, wherein said first non-connecting portion includes an arc portion.

6. The solar cell according to claim 1, wherein a cross-sectional area of said first non-connecting portion is not more than ½ the cross-sectional area of said first connecting portion.

7. The solar cell according to claim 1, wherein at least one of said first connecting portions adjacent to an end of said first main surface is arranged apart from the end of said first main surface.

8. The solar cell according to claim 1, wherein a second connecting portion connected to a second interconnector and a second non-connecting portion not directly connected to said second interconnector are formed alternately along a line parallel to said first common axis on a second main surface opposite to said first main surface of said semiconductor substrate.

9. The solar cell according to claim 1, wherein said first non-connecting portion has two non-connecting parts, each extending between and connecting said axially adjacent first connecting portions and each coupled to both of said axially adjacent two first connecting portions to respectively form said angle of larger than 90° and smaller than 180°, an entirety of an area defined between longitudinal end faces of the axially adjacent, connected first connecting portions and between said first non-connecting parts being a void that is devoid of structure in a plane that includes said two non-connecting parts and said first connecting portions.

10. A solar cell string comprising a plurality of solar cells defined in claim 8 connected, said solar cells adjacent to each other, wherein said first connecting portion of a first solar cell and said second connecting portion of a second solar cell are electrically connected by being connected to a common interconnector.

11. The solar cell string according to claim 1, wherein said second electrode has a longitudinal axis perpendicular to said first common axis.

12. The solar cell string according to claim 10, wherein a small cross-sectional area section having a cross-sectional area of said common interconnector locally reduced is arranged at at least one of a site corresponding to an inside region, adjacent to a side face of said first non-connecting portion and a longitudinal end face of said first connecting portion and a site corresponding to said second non-connecting portion.

13. A solar cell module comprising the solar cell string defined in claim 10 sealed with a sealant.

14. The solar cell according to claim 1, wherein a surface contour of an inside region adjacent to a side face of said first non-connecting portion and a longitudinal end face of said first connecting portion takes an arc shape at leading ends located at a side of a first connecting portion.

15. The solar cell according to claim 14, wherein the surface contour of said inside region takes a circular, an ellipse, or a track shape.

16. The solar cell according to claim 14, wherein a second connecting portion connected to a second interconnector and a second non-connecting portion not directly connected to said second interconnector are formed alternately on a second main surface opposite to said first main surface of said semiconductor substrate.

17. The solar cell according to claim 16, wherein a length of said inside region in a direction of arrangement of said first connecting portion and said first non-connecting portion is shorter than the length of said second non-connecting portion, facing said inside region with said semiconductor substrate therebetween, in a direction of arrangement of said second connecting portion and said second non-connecting portion.

18. The solar cell according to claim 16, including a portion where said second non-connecting portion is not formed at a location symmetric to the location where said inside region is formed about said semiconductor substrate.

19. A solar cell string comprising a plurality of solar cells defined in claim 16 connected, said solar cells adjacent to each other, wherein said first connecting portion of a first solar cell and said second connecting portion of a second solar cell are electrically connected by a common interconnector.

20. The solar cell string according to claim 19, wherein a small cross-sectional area section having a cross-sectional area of said common interconnector reduced locally is arranged at at least one of a site corresponding to said inside region and a site corresponding to said second non-connecting portion.

21. A solar cell module comprising the solar cell string defined in claim 19 sealed with a sealant.

* * * * *